US008476620B2

(12) United States Patent
Dobbs et al.

(10) Patent No.: US 8,476,620 B2
(45) Date of Patent: Jul. 2, 2013

(54) ORGANIC LIGHT-EMITTING DIODE LUMINAIRES

(75) Inventors: Kerwin D. Dobbs, Wilmington, DE (US); Norman Herron, Newark, DE (US); Vsevolod Rostovtsev, Swarthmore, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 67 days.

(21) Appl. No.: 12/861,154

(22) Filed: Aug. 23, 2010

(65) Prior Publication Data

US 2011/0204339 A1 Aug. 25, 2011

Related U.S. Application Data

(60) Provisional application No. 61/236,180, filed on Aug. 24, 2009.

(51) Int. Cl.
*H01L 51/54* (2006.01)
(52) U.S. Cl.
USPC .. 257/40; 257/29; 257/E51.024; 257/E51.022
(58) Field of Classification Search
USPC ............... 257/40, E51.024, E51.022; 438/29
See application file for complete search history.

(56) References Cited

U.S. PATENT DOCUMENTS

| | | | |
|---|---|---|---|
| 6,303,238 B1 | 10/2001 | Thompson et al. | |
| 6,627,333 B2 | 9/2003 | Hatwar | |
| 6,670,645 B2 | 12/2003 | Grushin et al. | |
| 6,680,578 B2 | 1/2004 | Antoniadis et al. | |
| 6,693,611 B1 * | 2/2004 | Burroughes | 345/83 |
| 6,875,524 B2 | 4/2005 | Hatwar et al. | |
| 7,147,935 B2 | 12/2006 | Kamatani et al. | |
| 7,250,512 B2 * | 7/2007 | Lecloux et al. | 546/4 |
| 7,362,796 B2 | 4/2008 | Shigeno | |
| 7,663,140 B2 | 2/2010 | Yamazaki et al. | |
| 7,803,469 B2 | 9/2010 | Lee et al. | |
| 7,816,859 B2 * | 10/2010 | Spindler et al. | 313/504 |
| 7,867,630 B2 | 1/2011 | Kim et al. | |

(Continued)

FOREIGN PATENT DOCUMENTS

| | | |
|---|---|---|
| EP | 0786925 A2 | 7/1997 |
| EP | 1061112 A1 | 12/2000 |

(Continued)

OTHER PUBLICATIONS

Chih-Hao Chang, Efficient White OLEDs Employing Phosphorescent Sensitization, Jun. 2007,Journal of Display Technology, vol. 3, No. 2.*

(Continued)

*Primary Examiner* — Marc Armand

(57) ABSTRACT

There is provided an organic light-emitting diode luminaire. The luminaire includes a patterned first electrode, a second electrode, and a light-emitting layer therebetween. The light-emitting layer includes a first plurality of pixels having an emission color that is blue; a second plurality of pixels having an emission color that is green, the second plurality of pixels being laterally spaced from the first plurality of pixels; and a third plurality of pixels having an emission color that is red-orange, the third plurality of pixels being laterally spaced from the first and second pluralities of pixels. The additive mixing of all the emitted colors results in an overall emission of white light.

13 Claims, 3 Drawing Sheets

U.S. PATENT DOCUMENTS

| | | | |
|---|---|---|---|
| 2001/0022496 A1 | 9/2001 | Kobayashi et al. | |
| 2002/0024293 A1 | 2/2002 | Igarashi et al. | |
| 2003/0072964 A1 | 4/2003 | Kwong et al. | |
| 2003/0076454 A1 | 4/2003 | Burroughes | |
| 2003/0124381 A1 | 7/2003 | Thompson et al. | |
| 2004/0033388 A1 | 2/2004 | Kim et al. | |
| 2004/0102577 A1 | 5/2004 | Hsu et al. | |
| 2004/0127637 A1 | 7/2004 | Hsu et al. | |
| 2004/0201064 A1 | 10/2004 | Hirai et al. | |
| 2004/0209118 A1 | 10/2004 | Seo et al. | |
| 2004/0262576 A1 | 12/2004 | Thompson et al. | |
| 2005/0064233 A1 | 3/2005 | Matsuura et al. | |
| 2005/0095452 A1 | 5/2005 | Begley et al. | |
| 2005/0100760 A1 | 5/2005 | Yokoyama | |
| 2005/0158577 A1 | 7/2005 | Ishibashi et al. | |
| 2005/0164033 A1 | 7/2005 | Chin et al. | |
| 2005/0184287 A1 | 8/2005 | Herron et al. | |
| 2005/0205860 A1 | 9/2005 | Hsu et al. | |
| 2005/0233167 A1 | 10/2005 | Che et al. | |
| 2005/0244670 A1 | 11/2005 | Saitoh et al. | |
| 2006/0008673 A1 | 1/2006 | Kwong et al. | |
| 2006/0009629 A1* | 1/2006 | Takahashi et al. | 536/23.1 |
| 2006/0033421 A1 | 2/2006 | Matsuura et al. | |
| 2006/0115676 A1 | 6/2006 | Igawa et al. | |
| 2006/0134460 A1 | 6/2006 | Kondakova et al. | |
| 2006/0152146 A1 | 7/2006 | Funahashi | |
| 2006/0210830 A1 | 9/2006 | Funahashi | |
| 2006/0267001 A1 | 11/2006 | Hung | |
| 2006/0283546 A1 | 12/2006 | Tremel et al. | |
| 2007/0015006 A1 | 1/2007 | Lee | |
| 2007/0029906 A1 | 2/2007 | Hack et al. | |
| 2007/0063638 A1 | 3/2007 | Tokairin et al. | |
| 2007/0078264 A1* | 4/2007 | Huo | 546/2 |
| 2007/0126347 A1 | 6/2007 | Jarikov et al. | |
| 2007/0145886 A1 | 6/2007 | Aziz et al. | |
| 2007/0212568 A1 | 9/2007 | Wang | |
| 2007/0275266 A1* | 11/2007 | Jinde et al. | 428/690 |
| 2007/0292713 A9 | 12/2007 | Dobbs et al. | |
| 2007/0292718 A1 | 12/2007 | Lecloux et al. | |
| 2008/0049413 A1 | 2/2008 | Jinde et al. | |
| 2008/0067473 A1 | 3/2008 | Walker et al. | |
| 2008/0116790 A1 | 5/2008 | Kho et al. | |
| 2008/0122348 A1 | 5/2008 | Jeong et al. | |
| 2008/0166566 A1* | 7/2008 | Prakash et al. | 428/421 |
| 2008/0241561 A1 | 10/2008 | Jeong et al. | |
| 2008/0268823 A1 | 10/2008 | Shalev | |
| 2008/0284317 A1 | 11/2008 | Liao et al. | |
| 2008/0284319 A1 | 11/2008 | Lee et al. | |
| 2008/0286605 A1* | 11/2008 | Takeda | 428/690 |
| 2009/0001327 A1* | 1/2009 | Werner et al. | 252/512 |
| 2009/0045736 A1 | 2/2009 | Kho et al. | |
| 2009/0189509 A1 | 7/2009 | Qiu et al. | |
| 2010/0314636 A1 | 12/2010 | Matsunami et al. | |

FOREIGN PATENT DOCUMENTS

| | | | |
|---|---|---|---|
| EP | 1561794 A1 | 8/2005 | |
| EP | 1905809 A2 | 4/2008 | |
| JP | 07142169 A | 6/1995 | |
| JP | 09204982 A | 8/1997 | |
| JP | 10161567 A | 6/1998 | |
| JP | 2003092002 A | 3/2003 | |
| JP | 2004141749 A | 5/2004 | |
| JP | 2005203364 A | 7/2005 | |
| JP | 2006019022 A | 1/2006 | |
| JP | 2006024648 A | 1/2006 | |
| JP | 2006040856 A | 2/2006 | |
| JP | 2006063233 A | 3/2006 | |
| JP | 2006245003 A | 9/2006 | |
| JP | 2006269253 A | 10/2006 | |
| JP | 2007011063 A | 1/2007 | |
| JP | 2007234268 A | 9/2007 | |
| JP | 2008078014 A | 4/2008 | |
| JP | 2008085363 A | 4/2008 | |
| JP | 2008270182 A | 11/2008 | |
| JP | 2009048829 A | 3/2009 | |
| KR | 1020050039674 A | 4/2005 | |
| KR | 1020050074208 A | 7/2005 | |
| KR | 1020070113435 A | 11/2007 | |
| KR | 1020080796615 B1 | 1/2008 | |
| KR | 1020080111512 A | 12/2008 | |
| KR | 1020090882911 B1 | 2/2009 | |
| KR | 1020090059488 A | 6/2009 | |
| KR | 1020090083275 A | 8/2009 | |
| KR | 100920533 B1 | 10/2009 | |
| WO | WO00/70655 | 11/2000 | |
| WO | WO01/41512 A1 | 6/2001 | |
| WO | WO03/008424 A1 | 1/2003 | |
| WO | WO03/040257 A1 | 5/2003 | |
| WO | WO03/063555 A1 | 7/2003 | |
| WO | WO03/091688 A2 | 11/2003 | |
| WO | WO2004/016710 A1 | 2/2004 | |
| WO | WO2005/052027 A1 | 6/2005 | |
| WO | 2006025512 A1 | 3/2006 | |
| WO | 2007021117 A1 | 2/2007 | |
| WO | 2007126752 A1 | 11/2007 | |
| WO | WO2009/018009 A1 | 2/2009 | |

OTHER PUBLICATIONS

Gregor Schwartz, High efficiency white organic light emitting diodes combining fluorescent and phosphorescent emitter systems, 2006, Organic O[toelectronics and Photonics II, edited by Paul. Heremans, Proc. of SPIE vol. 6192,61920Q.*

Cheon et al.—Bright White Small Molecular Organic Light Emitting Devices . . . , APL, 2002, vol. 81 pp. 1738-1740.

D'Andrade et al.—Efficient Organic Electrophosporescent White Light Emitting Device, Advanced Material, 2004, vol. 16, No. 7, pp. 624-628.

International Search Report, in PCT/US2009/048746, Korean Intellectual Property Office, Daejeon, ROK, Ju Seung Kim Authorized Officer, Jun. 14, 2010.

International Search Report, in PCT/US2009/048752, Korean Intellectual Property Office, Daejeon, ROK, Ju Seung Kim Authorized Officer, Jun. 14, 2010.

International Search Report, in PCT/US2010/046306, Korean Intellectual Property Office, Daejeon, ROK, Ju Seung Kim Authorized Officer, Mar. 25, 2011.

International Search Report, in PCT/US2010/046317, Korean Intellectual Property Office, Daejeon, ROK, Ju Seung Kim Authorized Officer, Apr. 26, 2011.

International Search Report, in PCT/US2010/046322, Korean Intellectual Property Office, Daejeon, ROK, Yeong Kyo Shin, Authorized Officer, Mar. 30, 2011.

International Search Report, in PCT/US2010/46328, Korean Intellectual Property Office, Daejeon, ROK, Ju Seung Kim Authorized Officer, Mar. 25, 2011.

International Search Report, in PCT/US2010/46337, Korean Intellectual Property Office, Daejeon, ROK, Yeong Kyo Shin, Authorized Officer, Mar. 30, 2011.

International Search Report, in PCT/US2010/046347, Korean Intellectual Property Office, Daejeon, ROK, Yeong Kyo Shin, Authorized Officer, Mar. 31, 2011.

CRC Handbook of Chemistry and Physics, 81$^{st}$ Edition (2000-2001) (Book Not Included).

"Flexible light-emitting diodes made from soluble conducting polymer" Nature, vol. 357, pp. 477 479 (Jun. 11, 1992).

Kirk-Othmer Encyclopedia of Chemical Technology, Fourth Edition, vol. 18, pp. 837-860, 1996 Y. Wang.

Ge et al., "Solution Processible Bipolar Triphenylamine Benzimidazole Derivatives for Highly Efficient Single Layer Organic Light Emitting Diodes," Chemistry of Materials, 2008, vol. 20, pp. 2532-2537.

Shih et al., "Novel Carbazole/Fluorene Hybrids: Host Materials for Blue Phosphorescent OLEDs," Organic Letters, 2006, vol. 8, pp. 2799-2802.

International Search Report for Application No. PCT/US2010/059825; Kim, Ju Seung, Authorized Officer; KIPO; Jun. 21, 2011.

Extended European Search Report for Application No. 09771086.7, counterpart to U.S. Appl. No. 12/993,259; Jul. 10, 2012.

International Search Report for Application No. PCT/US2010/059789; Kim, Je Seung, Authorized Officer; KIPO; May 31, 2011.

International Search Report for Application No. PCT/US2010/054394; Ju Seung Kim, Authorized Officer; Korean Intellectual Property Office; Jun. 20, 2011.

International Search Report for Application No. PCT/US2010/054404; Kim, Ju Seung, Authorized Officer; KIPO; May 31, 2011.

International Search Report for Application No. PCT/US2010/054724; Ju Seung Kim, Authorized Officer; Korean Intellectual Property Office; Jun. 20, 2011.

International Search Report for Application No. PCT/US2010/059726; Kim, Ju Seung, Authorized Officer; KIPO; May 27, 2011.

International Search Report for Application No. PCT/US2010/059787; Kim, Ju Seung, Authorized Officer; KIPO; May 31, 2011.

Endo et al., " Measurement of Photoluminescence Efficiency of Ir(III)phenylpyridine Derivatives in Solution and Solid-State Films," Chemical Physics Letters, 2008, vol. 460, pp. 155-157.

* cited by examiner

ORGANIC LIGHT-EMITTING DIODE LUMINAIRES

RELATED APPLICATION

This application claims priority under 35 U.S.C. §119(e) from Provisional Application No. 61/236,180 filed Aug. 24, 2009 which is incorporated by reference in its entirety.

BACKGROUND INFORMATION

1. Field of the Disclosure

This disclosure relates in general to organic light-emitting diode ("OLED") luminaires. It also relates to a process for making such devices.

2. Description of the Related Art

Organic electronic devices that emit light are present in many different kinds of electronic equipment. In all such devices, an organic active layer is sandwiched between two electrodes. At least one of the electrodes is light-transmitting so that light can pass through the electrode. The organic active layer emits light through the light-transmitting electrode upon application of electricity across the electrodes. Additional electroactive layers may be present between the light-emitting layer and the electrode(s).

It is well known to use organic electroluminescent compounds as the active component in light-emitting diodes. Simple organic molecules, such as anthracene, thiadiazole derivatives, and coumarin derivatives are known to show electroluminescence. In some cases these small molecule materials are present as a dopant in a host material to improve processing and/or electronic properties.

OLEDs emitting different colors, usually red, green, and blue, can be used in subpixel units to emit white light. OLEDs emitting white light can be used for lighting applications.

There is a continuing need for new OLED structures and processes for making them for lighting applications.

SUMMARY

There is provided an organic light-emitting diode luminaire comprising a patterned first electrode, a second electrode, and a light-emitting layer therebetween, the light-emitting layer comprising:
  a first plurality of pixels comprising a first electroluminescent material having an emission color that is blue;
  a second plurality of pixels comprising a second electroluminescent material having an emission color that is green, the second plurality of pixels being laterally spaced from the first plurality of pixels; and
  a third plurality of pixels comprising a third electroluminescent material having an emission color that is red-orange, the third plurality of pixels being laterally spaced from the first and second pluralities of pixels;
wherein the additive mixing of the three emitted colors results in an overall emission of white light.

There is also provided a process for making an OLED luminaire, comprising:
  providing a substrate having a first patterned electrode thereon;
  depositing a first liquid composition in a first pixellated pattern to form a first deposited composition, the first liquid composition comprising a first electroluminescent material in a first liquid medium, said first electroluminescent material having a first emission color;
  depositing a second liquid composition in a second pixellated pattern which is laterally spaced from the first pixellated pattern to form a second deposited composition, the second liquid composition comprising a second electroluminescent material in a second liquid medium, said second electroluminescent material having a second emission color;
  depositing a third liquid composition in a third pixellated pattern which is laterally spaced from the first and second pixellated patterns to form a third deposited composition, the third liquid composition comprising a third electroluminescent material in a third liquid medium, said third electroluminescent material having a third emission color;
  drying the deposited compositions to form pluralities of pixels; and
  forming a second electrode over all the pixels;
wherein one of the emission colors is blue, one of the emission colors is green, and one of the emission colors is red-orange.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1B:
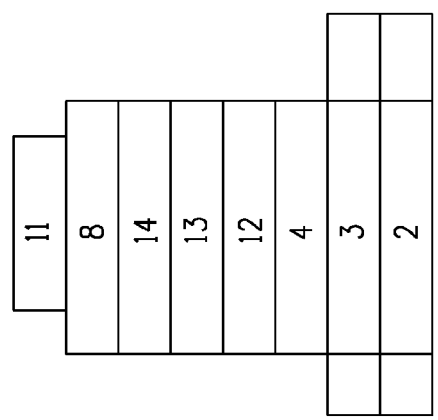
FIG. 1(b) is an illustration of another prior art white light-emitting device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Luminaire, Materials, the Process and finally Examples.

1. DEFINITIONS AND CLARIFICATION OF TERMS

Before addressing details of embodiments described below, some terms are defined or clarified.

As used herein, the term "alkoxy" refers to the group RO—, where R is an alkyl.

The term "alkyl" is intended to mean a group derived from an aliphatic hydrocarbon having one point of attachment, and includes a linear, a branched, or a cyclic group. The term is intended to include heteroalkyls. The term "hydrocarbon alkyl" refers to an alkyl group having no heteroatoms. In some embodiments, an alkyl group has from 1-20 carbon atoms.

The term "aryl" is intended to mean a group derived from an aromatic hydrocarbon having one point of attachment. The term "aromatic compound" is intended to mean an organic compound comprising at least one unsaturated cyclic group having delocalized pi electrons. The term is intended include heteroaryls. The term "hydrocarbon aryl" is intended to mean aromatic compounds having no heteroatoms in the ring. In some embodiments, an aryl group has from 3-30 carbon atoms.

The term "blue" refers to an emission with color coordinates of x=0.12-0.14 and y=0.15-0.21.

The term "color coordinates" refers to the x- and y-coordinates according to the C.I.E. chromaticity scale (Commission Internationale de L'Eclairage, 1931).

The term "CRI" refers to the CIE Color Rendering Index. It is a quantitative measure of the ability of a light source to reproduce the colors of various objects faithfully in comparison with an ideal or natural light source. A reference source, such as black body radiation, is defined as having a CRI of 100.

The term "drying" is intended to mean the removal of at least 50% by weight of the liquid medium; in some embodiments, at least 75% by weight of the liquid medium. A "partially dried" layer is one in which some liquid medium remains. A layer which is "essentially completely dried" is one which has been dried to an extent such that further drying does not result in any further weight loss.

The term "electroluminescence" refers to the emission of light from a material in response to an electric current passed through it. "Electroluminescent" refers to a material that is capable of electroluminescence.

The prefix "fluoro" indicates that one or more available hydrogen atoms have been replaced with a fluorine atom.

The term "green" refers to an emission with color coordinates of x=0.20-0.30 and y=0.55-0.70.

The prefix "hetero" indicates that one or more carbon atoms have been replaced with a different atom. In some embodiments, the different atom is N, O, or S.

The term "laterally spaced" refers to spacing within the same plane, where the plane is parallel to the plane of the first electrode.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "liquid medium" is intended to mean a liquid material, including a pure liquid, a combination of liquids, a solution, a dispersion, a suspension, and an emulsion. Liquid medium is used regardless whether one or more solvents are present.

The term "luminaire" refers to a lighting panel, and may or may not include the associated housing and electrical connections to the power supply.

The term "overall emission" as it refers to a luminaire, means the perceived light output of the luminaire as a whole.

The term "pitch" as it refers to pixels, means the distance from the center of a pixel to the center of the next pixel of the same color.

The term "red-orange" refers to an emission with color coordinates of x=0.62+/−0.02 and y=0.35+/−0.03.

The term "silyl" refers to the group $R_3Si$—, where R is H, D, C1-20 alkyl, fluoroalkyl, or aryl. In some embodiments, one or more carbons in an R alkyl group are replaced with Si.

In some embodiments, the silyl groups are $(hexyl)_2Si(CH_3)$ $CH_2CH_2Si(CH_3)_2$— and $[CF_3(CF_2)_6CH_2CH_2]_2Si(CH_3)$—.

The term "white light" refers to light perceived by the human eye as having a white color.

All groups may be unsubstituted or substituted. In some embodiments, the substituents are selected from the group consisting of D, halide, alkyl, alkoxy, aryl, aryloxy, and fluoroalkyl.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. THE LUMINAIRE

Figure 1A:
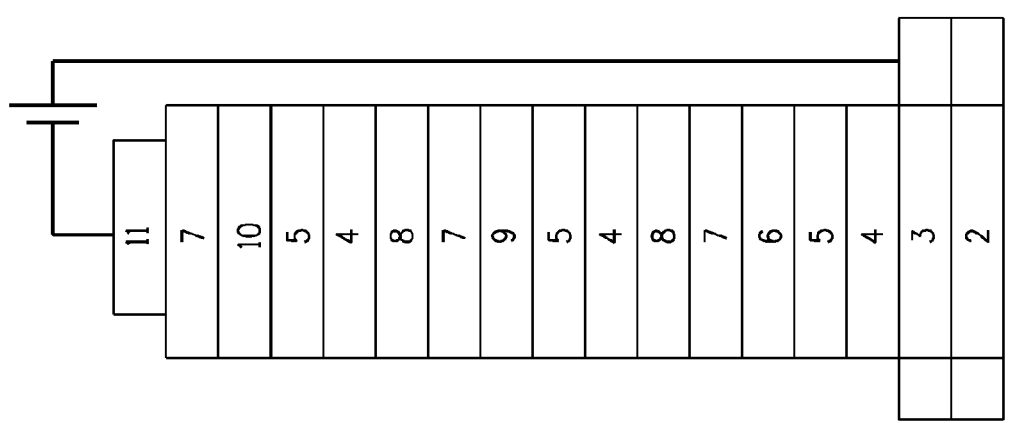
FIG. 1(a) is an illustration of one prior art white light-emitting device.

It is known to have white light-emitting layers in which emissive layers of different colors are stacked on top of each other between an anode and a cathode. Two exemplary prior art devices are shown in FIG. 1. In FIG. 1a, the anode 3 and the cathode 11 have a blue light-emitting layer 6, a green light-emitting layer 9, and a red light-emitting layer 10 stacked between them on substrate 2. On either side of the light-emitting layers are hole transport layers 4, electron transport layers 8. There are also hole blocking layers 7 and electron blocking layers 5. In FIG. 1b, the substrate 2, anode 3, hole transport layer 4, electron transport layer 8 and cathode 11 are present as shown. Light-emitting layer 12 is a combination of yellow and red light-emitters in a host material. Light-emitting layer 13 is a blue light-emitting in a host material. Layer 14 is an additional layer of host material.

The luminaire described herein has light emitting layers that are arranged laterally with respect to each other rather than in a stacked configuration.

The luminaire has a first patterned electrode, a second electrode, and a light-emitting layer therebetween. The light-emitting layer comprises a first plurality of pixels having blue emission, a second plurality of pixels having green emission, and a third plurality of pixels having red-orange emission. The pluralities of pixels are laterally spaced from each other. The additive mixing of the emitted colors results in an overall emission of white light. At least one of the electrodes is at least partially transparent to allow for transmission of the generated light.

One of the electrodes is an anode, which is an electrode that is particularly efficient for injecting positive charge carriers. In some embodiments, the first electrode is an anode. In some embodiments, the anode is patterned into parallel stripes. In some embodiments, the anode is at least partially transparent.

The other electrode is a cathode, which is an electrode that is particularly efficient for injecting electrons or negative charge carriers. In some embodiments, the cathode is a continuous, overall layer. The individual pixels can be of any geometric shape. In some embodiments, they are rectangular or oval.

In some embodiments, the first plurality of pixels is arrayed in parallel stripes of pixels. In some embodiments, the first, second and third pluralities of pixels are arrayed in alternating parallel stripes of pixels.

The pixel resolution is high enough so that the first, second and third colors are not seen individually, and the overall emission is of white light. In some embodiments, the pitch between pixels of the same color is no greater than 200 microns. In some embodiments the pitch is no greater than 150 microns. In some embodiments, the pitch is no greater than 100 microns.

The electroluminescent materials can be chosen based on high luminous efficiency instead, as long as high CRI values are obtainable.

Figure 2A:
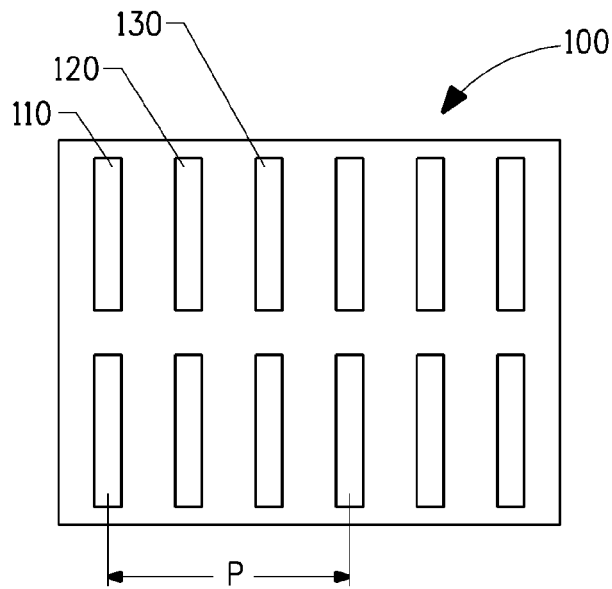
FIG. 2(a) is an illustration of a pixel format for an OLED display.
Figure 2B:
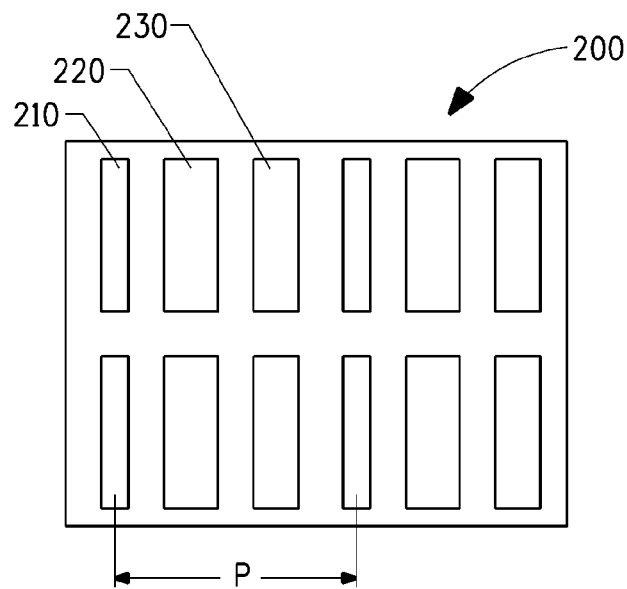
FIG. 2(b) is an illustration of a pixel format for an OLED luminaire.

In some embodiments, the pixels of each color have different sizes. This can be done in order to obtain the best mix of color to achieve white light emission. In the embodiments with parallel stripes of pixels, the width of the pixels can be different. The widths are chosen to allow the correct color balance while each color is operating at the same operating voltage. An illustration of this is given in FIG. 2. FIG. 2(a) shows the typical layout of an OLED display 100, with pixels 110, 120, and 130 having equal width. This layout may also be used for the luminaire described herein. FIG. 2(b) shows another embodiment of the layout for an OLED luminaire 200, with pixels 210, 220, and 230, which have different widths. The pixel pitch is shown as "p".

The OLED device also includes bus lines for delivering power to the device. In some embodiments, some of the bus lines are present in the active area of the device, spaced between the lines of pixels. The bus lines may be present between every x number of pixel lines, where x is an integer and the value is determined by the size and electronic requirements of the luminaire. In some embodiments, the bus lines are present every 10-20 pixel lines. In some embodiments, the metal bus lines are ganged together to give only one electrical contact for each color.

Figure 3:
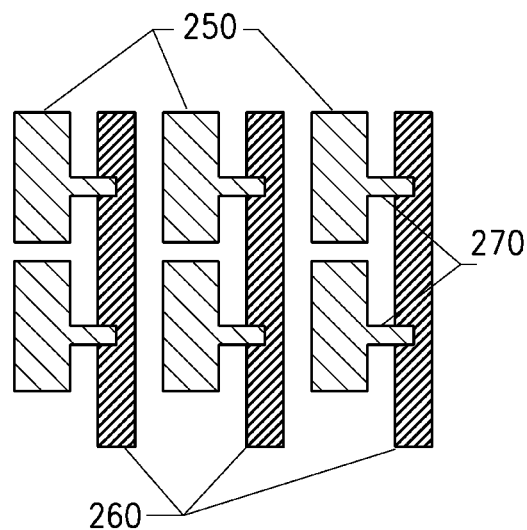
FIG. 3 is an illustration of an anode design.

The ganging together of the electrodes allows for simple drive electronics and consequently keeps fabrication costs to a minimum. A potential problem that could arise with such a design is that the development of an electrical short in any of the pixels could lead to a short-circuit of the whole luminaire and a catastrophic failure. In some embodiments, this can be addressed by designing the pixels to have individual "weak links". As a result, a short in any one pixel will only cause a failure of that pixel—the rest of the luminaire will continue to function with an unnoticed reduction in light output. One possible anode design is shown in FIG. 3. The anode 250 is connected to the metal bus line 260 by a narrow stub 270. The stub 270 is sufficient to carry the current during operation but will fail if the pixel should short circuit, thereby isolating the short to a single pixel.

In some embodiments, the OLED luminaire includes bank structures to define the pixel openings. The term "bank structure" is intended to mean a structure overlying a substrate, wherein the structure serves a principal function of separating an object, a region, or any combination thereof within or overlying the substrate from contacting a different object or different region within or overlying the substrate.

In some embodiments, the OLED luminaire further comprises additional layers. In some embodiments, the OLED luminaire further comprises one or more charge transport layers. The term "charge transport," when referring to a layer, material, member, or structure is intended to mean such layer, material, member, or structure facilitates migration of such charge through the thickness of such layer, material, member, or structure with relative efficiency and small loss of charge. Hole transport layers facilitate the movement of positive charges; electron transport layers facilitate the movements of negative charges. Although electroluminescent materials may also have some charge transport properties, the term "charge transport layer, material, member, or structure" is not intended to include a layer, material, member, or structure whose primary function is light emission.

In some embodiments, the OLED luminaire further comprises one or more hole transport layers between the electroluminescent layer and the anode. In some embodiments, the OLED luminaire further comprises one or more electron transport layers between the electroluminescent layer and the cathode.

In some embodiments, the OLED luminaire further comprises a hole injection layer between the anode and a hole transport layer. The term "hole injection layer" or "hole injection material" is intended to mean electrically conductive or semiconductive materials. The hole injection layer may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device.

Figure 4:
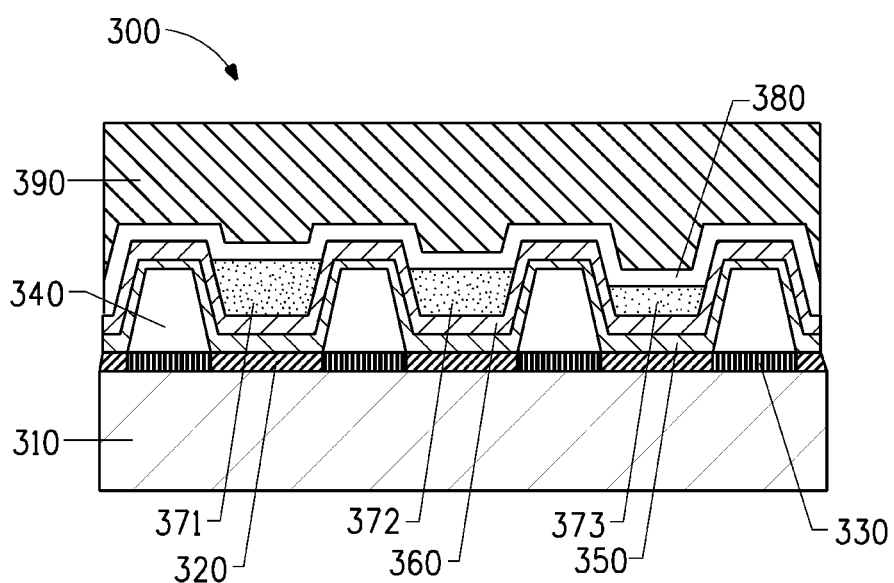
FIG. 4 is an illustration of an OLED luminaire.

One example of an OLED luminaire is illustrated in FIG. 4. OLED luminaire 300 has substrate 310 with anode 320 and bus lines 330. Bank structures 340 contain the organic layers: hole injection layer 350, hole transport layer 360, and the electroluminescent layers 371, 372, and 373, for colors red-orange, green, and blue, respectively. The electron transport layer 380 and cathode 390 are applied overall.

The OLED luminaire can additionally be encapsulated to prevent deterioration due to air and/or moisture. Various encapsulation techniques are known. In some embodiments, encapsulation of large area substrates is accomplished using a thin, moisture impermeable glass lid, incorporating a desiccating seal to eliminate moisture penetration from the edges of the package. Encapsulation techniques have been described in, for example, published U.S. application 2006-0283546.

There can be different variations of OLED luminaires which differ only in the complexity of the drive electronics (the OLED panel itself is the same in all cases). The drive electronics designs can still be very simple.

In one embodiment, unequal pixel widths are chosen so that the desired white point is achieved with all three colors operating at the same voltage (around 5-6V). All three colors are ganged together. The required drive electronics is thus a simple stabilized DC voltage supply.

In one embodiment, unequal pixel widths are chosen and the three colors are driven by three separate DC supplies, thereby allowing each color to be adjusted independently. This gives the possibility of a user selectable white point (e.g. to simulate sunlight, incandescent lamps or fluorescent lighting). This also allows for the adjustment of the color point if the color should drift as the luminaire ages. This design requires three DC voltage supplies. It is also possible that the luminaire could be programmed to cycle through a range of colors. This has potentially interesting application in commercial advertising or store displays.

In some embodiments, accurate white point color is required and color drift with ageing is not acceptable. In this case, unequal pixel widths are chosen and the three colors are driven by three separate DC supplies. In addition, the luminaire includes an external color sensor allowing the colors to be automatically adjusted to maintain the white point color.

3. MATERIALS a. Electroluminescent Layer

Any type of electroluminescent ("EL") material can be used in the electroluminescent layer, including, but not limited to, small molecule organic luminescent compounds, luminescent metal complexes, conjugated polymers, and mixtures thereof. Examples of luminescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

In some embodiments, the first electroluminescent material with blue emission color is an organometallic complex of Ir. In some embodiments, the organometallic Ir complex is a tris-cyclometallated complex having the formula $IrL_3$ or a bis-cyclometallated complex having the formula $IrL_2Y$, where Y is a monoanionic bidentate ligand and L has a formula selected from the group consisting of Formula L-1 through Formula L-12:

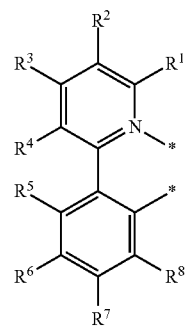

L-1

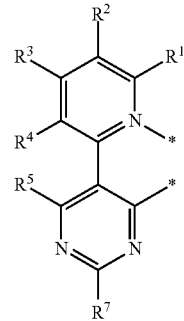

L-2

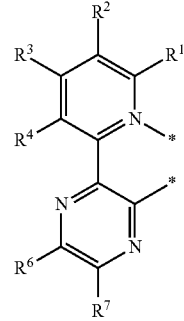

L-3

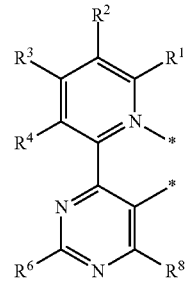

L-4

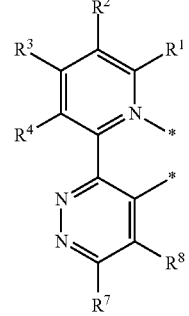

L-5

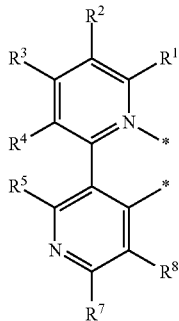

L-6

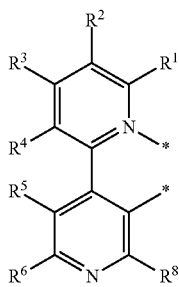

L-7

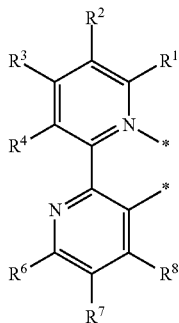

L-8

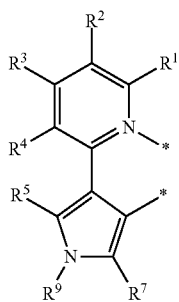

L-9

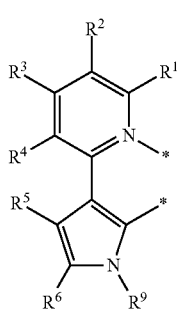

L-10

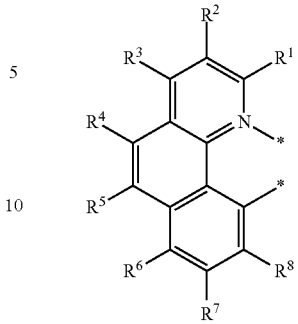

L-11

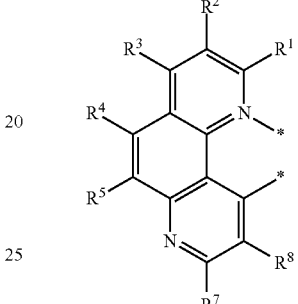

L-12 where $R^1$ through $R^8$ are the same or different and are selected from the group consisting of H, D, electron-donating groups, and electron-withdrawing groups, and $R^9$ is H, D or alkyl.

The emitted color is tuned by the selection and combination of electron-donating and electron-withdrawing substituents. In addition, the color is tuned by the choice of Y ligand in the bis-cyclometallated complexes. Shifting the color to shorter wavelengths is accomplished by (a) selecting one or more electron-donating substituents for $R^1$ through $R^4$; and/or (b) selecting one or more electron-withdrawing substituents for $R^5$ through $R^8$; and/or (c) selecting a bis-cyclometallated complex with ligand Y-1, shown below. Conversely, shifting the color to longer wavelengths is accomplished by (a) selecting one or more electron-withdrawing substituents for $R^1$ through $R^4$; and/or (b) selecting one or more electron-donating substituents for $R^5$ through $R^8$; and/or (c) selecting a bis-cyclometallated complex with ligand Y-2, shown below. Examples of electron-donating substituents include, but are not limited to, alkyl, silyl, alkoxy, and dialkylamino. Examples of electron-withdrawing substituents include, but are not limited to, F, CN, fluoroalkyl, and fluoroalkoxy. Substituents may also be chosen to affect other properties of the materials, such as solubility, air and moisture stability, emissive lifetime, and others.

In some embodiments of Formulae L-1 through L-12, at least one of $R^1$ through $R^4$ is an electron-donating substituent. In some embodiments of Formula L-1, at least one of $R^5$ through $R^8$ is an electron-withdrawing substituent.

In some embodiments of Formulae L-1 through L-12:
$R^1$ is H, D, F, or alkyl;
$R^2$ is H, D or alkyl;
$R^3$=H, D, F, alkyl, $OR^{10}$, $NR^{10}_2$;
$R^4$=H or D
$R^5$=H, D or F;
$R^6$=H, D, F, CN, aryl, fluoroalkyl, or diaryloxophosphinyl;
$R^7$=H, D, F, alkyl, aryl, or diaryloxophosphinyl;
$R^8$=H, D, CN, alkyl, fluoroalkyl;
$R^9$=H, D, alkyl; aryl;
$R^{10}$=alkyl, where adjacent $R^{10}$ groups can be joined to form a saturated ring; and
* represents a point of coordination with Ir.

In some embodiments, Y is selected from the group consisting of Y-1, Y-2 and Y-3 wherein:

R[11] is the same or different at each occurrence and is selected from the group consisting of alkyl and fluoroalkyl;

R[12] is H, D or F; and

R[13] is the same or different at each occurrence and is selected from the group consisting of alkyl and fluoroalkyl.

In some embodiments, the alkyl and fluoroalkyl groups have 1-5 carbon atoms. In some embodiments, the alkyl group is methyl. In some embodiments, the fluoroalkyl group is trifluoromethyl. In some embodiments, the aryl group is a heteroaryl. In some embodiments, the aryl group is a phenyl group having one or more substituents selected from the group consisting of F, CN, and $CF_3$. In some embodiments, the aryl group is selected from the group consisting of o-fluorophenyl, m-fluorophenyl, p-fluorophenyl, p-cyanophenyl, and 3,5-bis(trifluoromethyl)phenyl. In some embodiments, the diaryloxophosphinyl group is diphenyloxophosphinyl.

In some embodiments, the organometallic Ir complex having blue emission color has the formula $IrL_3$. In some embodiments, the complex has the formula $IrL_3$, where L is Formula L-1, $R^5$ is H, D and $R^6$ is F, aryl, heteroaryl, or diaryloxophosphinyl. In some embodiments, $R^5$ is F and $R^6$ is H or D. In some embodiments, two or more of $R^5$, $R^6$, $R^7$ and $R^8$ are F.

In some embodiments, the organometallic Ir complex having blue emission color has the formula $IrL_2Y$. In some embodiments, the complex has the formula $IrL_2Y$, where L is Formula L-1, $R^1$, $R^2$, $R^6$ and $R^8$ are H or D. In some embodiments, $R^5$ and $R^7$ are F.

Examples of organometallic Ir complexes having blue emission color include, but are not limited to:

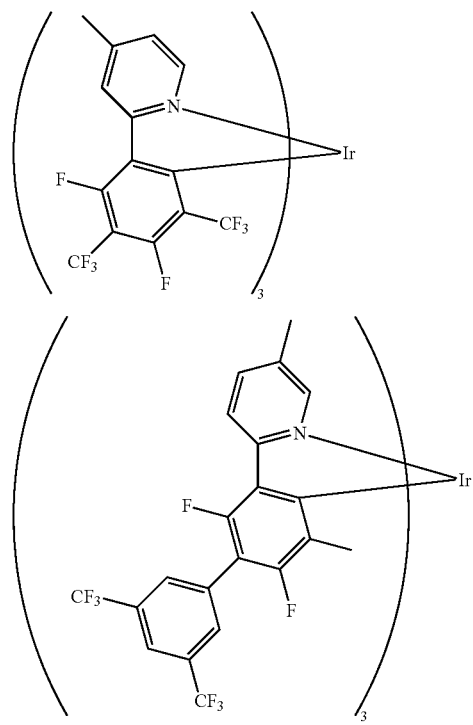

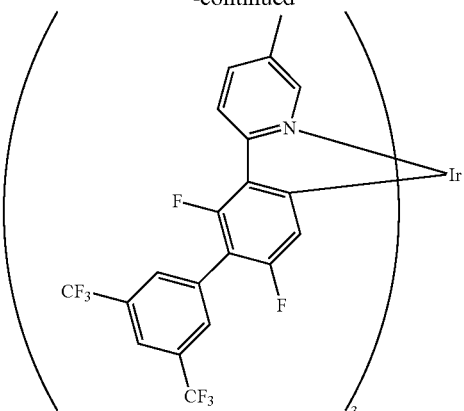

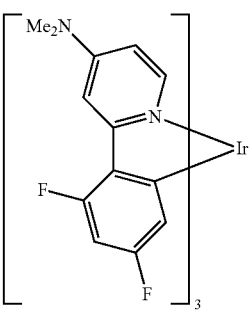

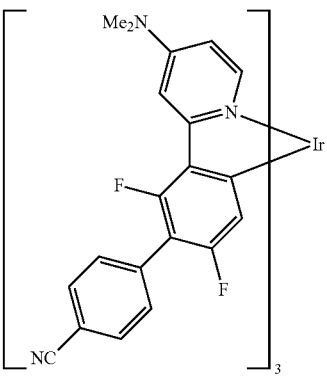

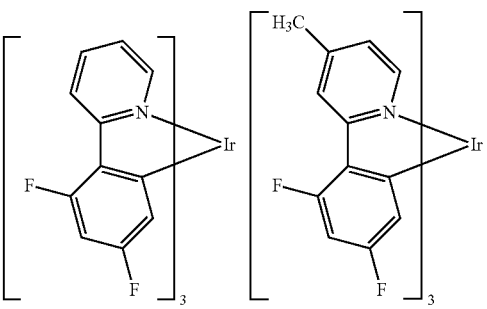

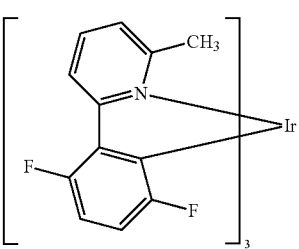

-continued

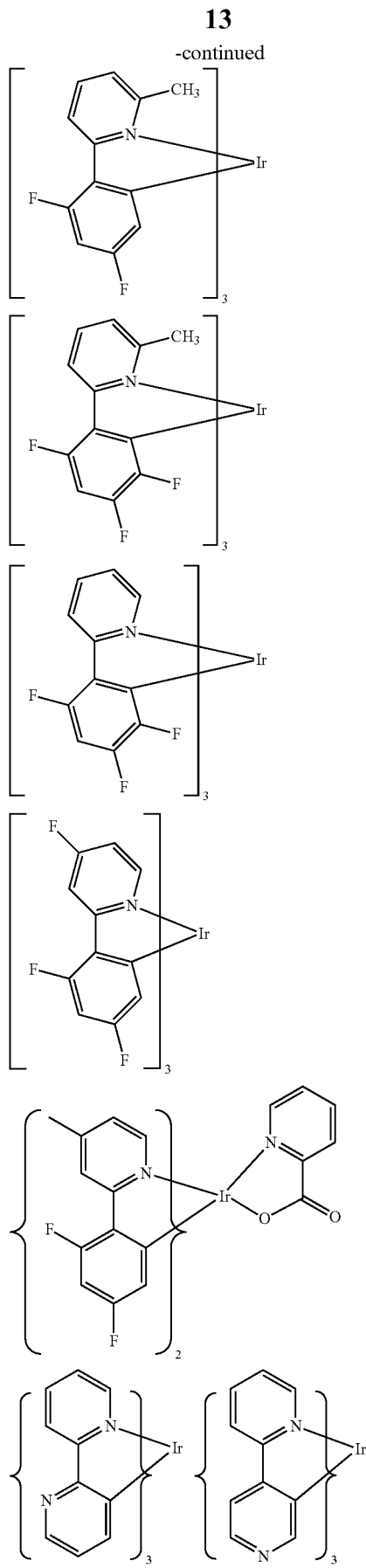

-continued

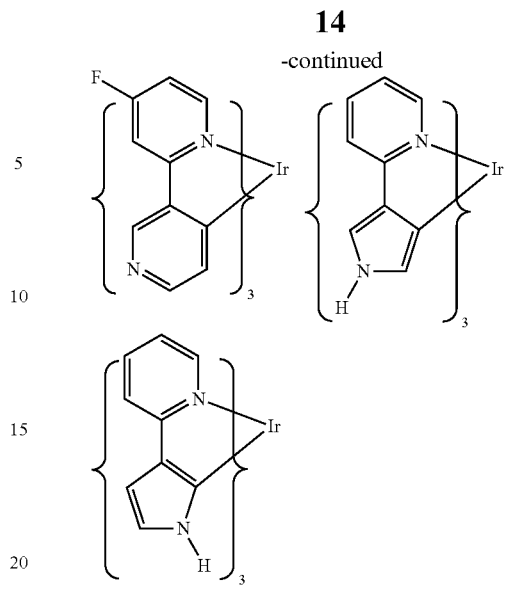

In some embodiments, the first electroluminescent material with blue emission color is a small molecule luminescent organic compound. In some embodiments, the luminescent organic compound is a chrysene derivative having Formula I

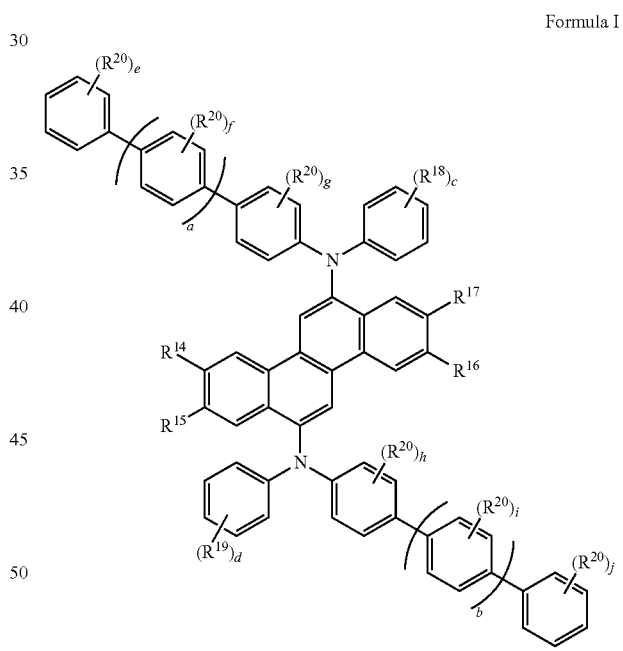

Formula I wherein:
$R^{14}$, $R^{15}$, $R^{16}$ and $R^{17}$ are the same or different and are selected from the group consisting of H, D, and alkyl, where $R^{14}$ and $R^{15}$ groups or $R^{16}$ and $R^{17}$ groups may be joined together to form a 5- or 6-membered aliphatic ring;

$R^{18}$ and $R^{19}$ are the same or different and are selected from the group consisting of D, alkyl groups, silyl groups, m-phenyl, o-phenyl, p-phenyl, m-N-carbazolyl, and p-N-carbazolyl;

$R^{20}$ is the same or different at each occurrence and is selected from the group consisting of D, alkyl groups, silyl groups, phenyl, and biphenyl, or two adjacent $R^{20}$ groups can join together to form a naphthyl or fluorenyl group;

a and b are the same or different and are an integer from 0-10;

c and d are the same or different and are an integer from 1-5;

f, g, h, and i, are the same or different at each occurrence and are an integer from 0-4; and e and j are the same or different at each occurrence and are an integer from 0-5.

Examples of chrysene compounds with blue emission color include, but are not limited to:

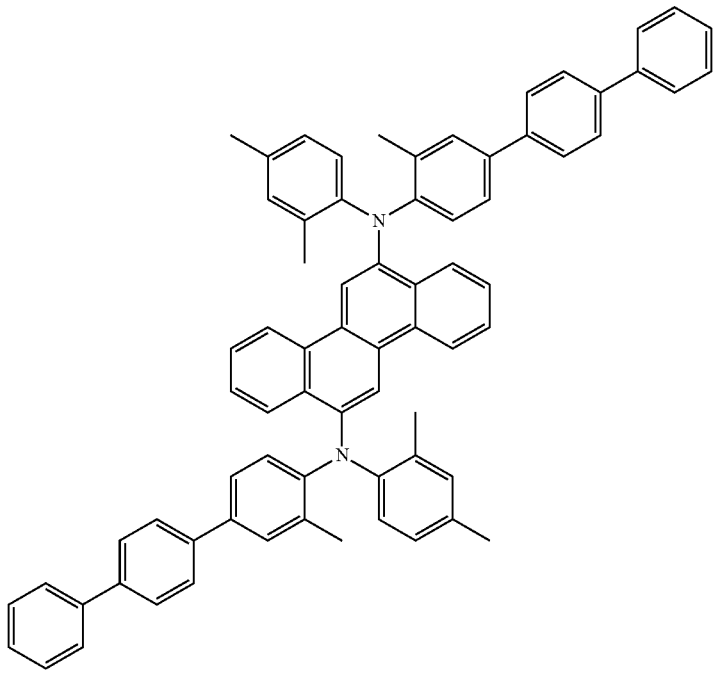

$C_{72}H_{58}N_2$
Exact Mass: 950.46
Mol. Wt.: 951.24
C, 90.91; H, 6.15; N, 2.94

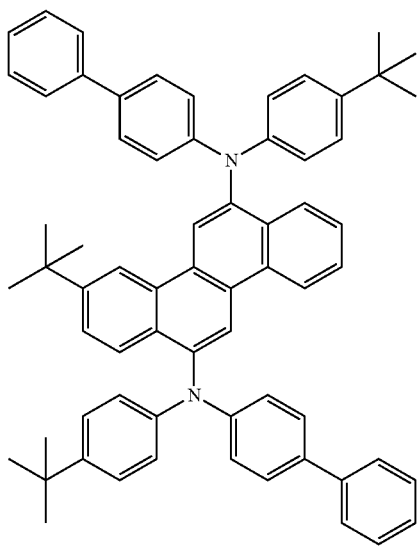

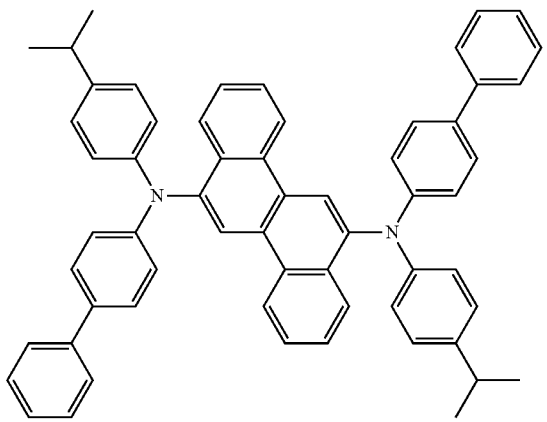

$C_{60}H_{50}N_2$
Exact Mass: 798.40
Mol. Wt.: 799.05
C, 90.19; H, 6.31; N, 3.51

-continued
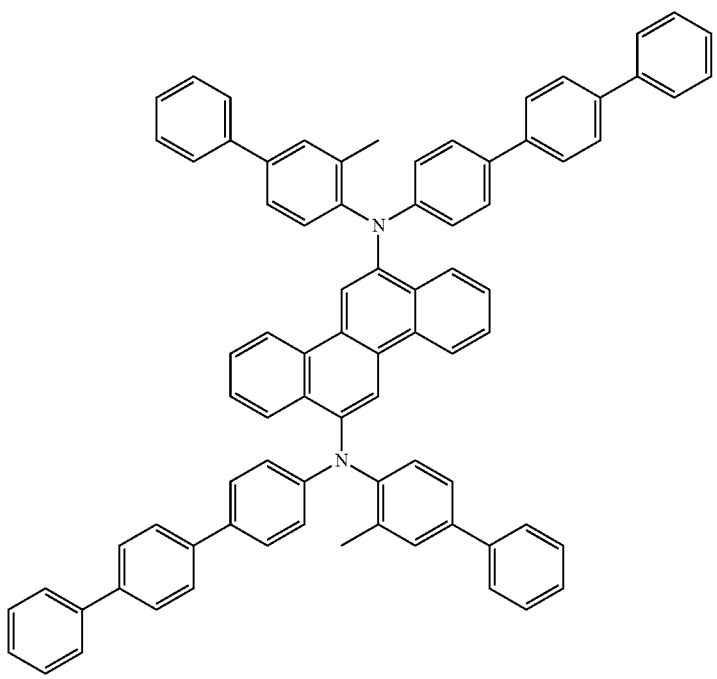
C₈₀H₅₈N₂
Exact Mass: 1046.46
Mol. Wt.: 1047.33
C, 91.74; H, 5.58; N, 2.67
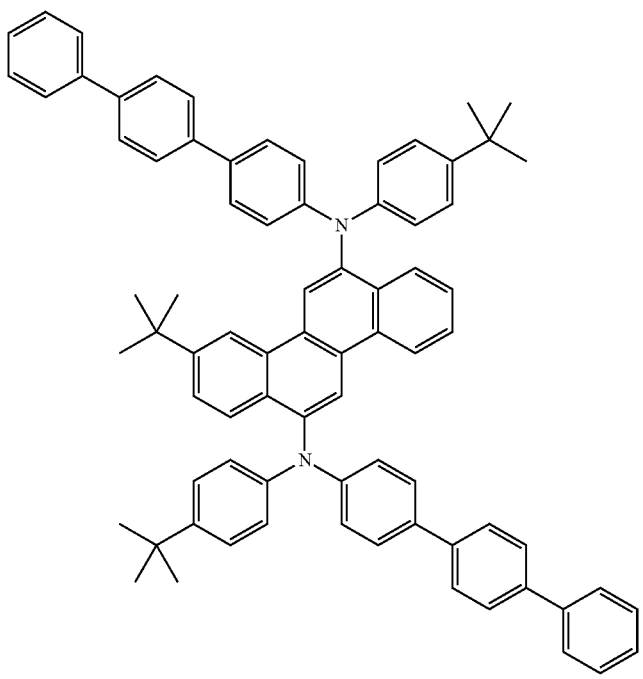
C₇₈H₇₀N₂
Exact Mass: 1034.55
Mol. Wt.: 1035.40
C, 90.48; H, 6.81; N, 2.71

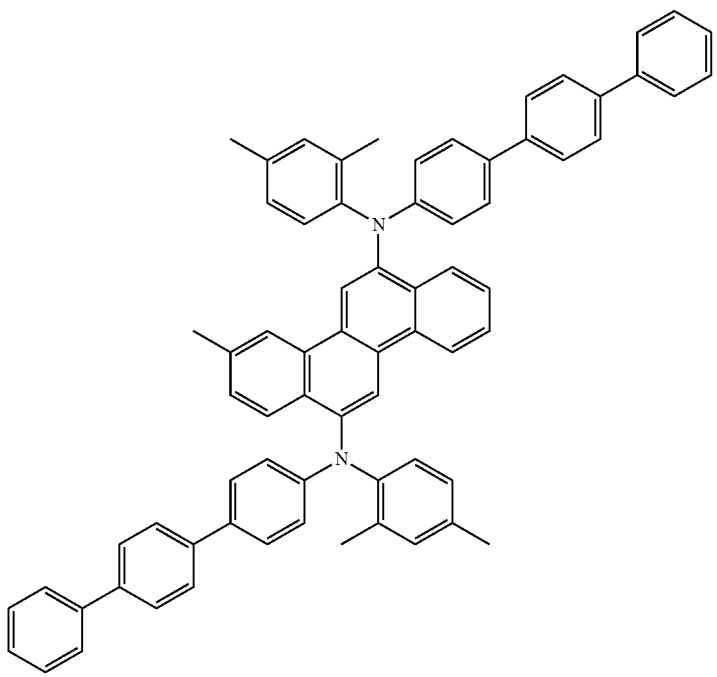
C₇₁H₅₆N₂
Exact Mass: 936.44
Mol. Wt.: 937.22
C, 90.99; H, 6.02; N, 2.99
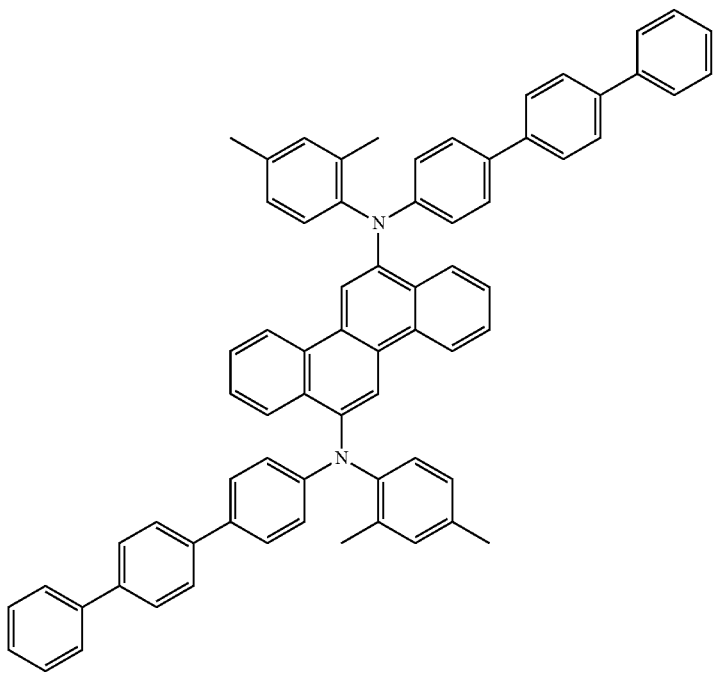
C₇₀H₅₄N₂
Exact Mass: 922.43
Mol. Wt.: 923.19
C, 91.07; H, 5.90; N, 3.03

-continued
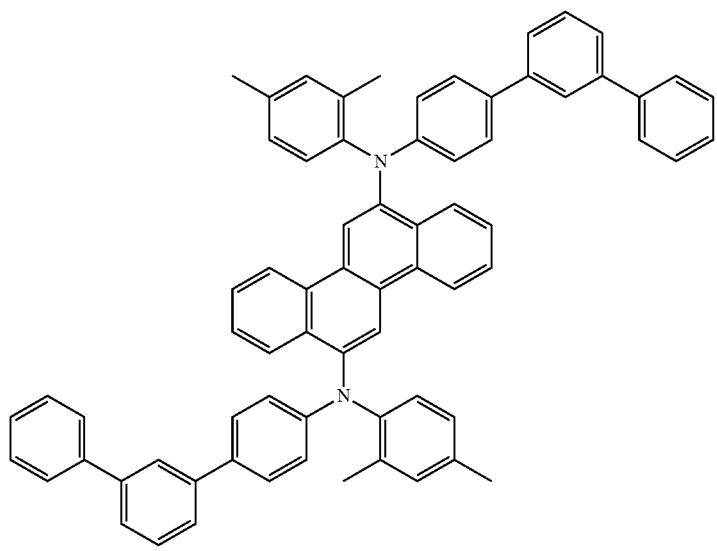
C₇₀H₅₄N₂
Exact Mass: 922.43
Mol. Wt.: 923.19
C, 91.07; H, 5.90; N, 3.03
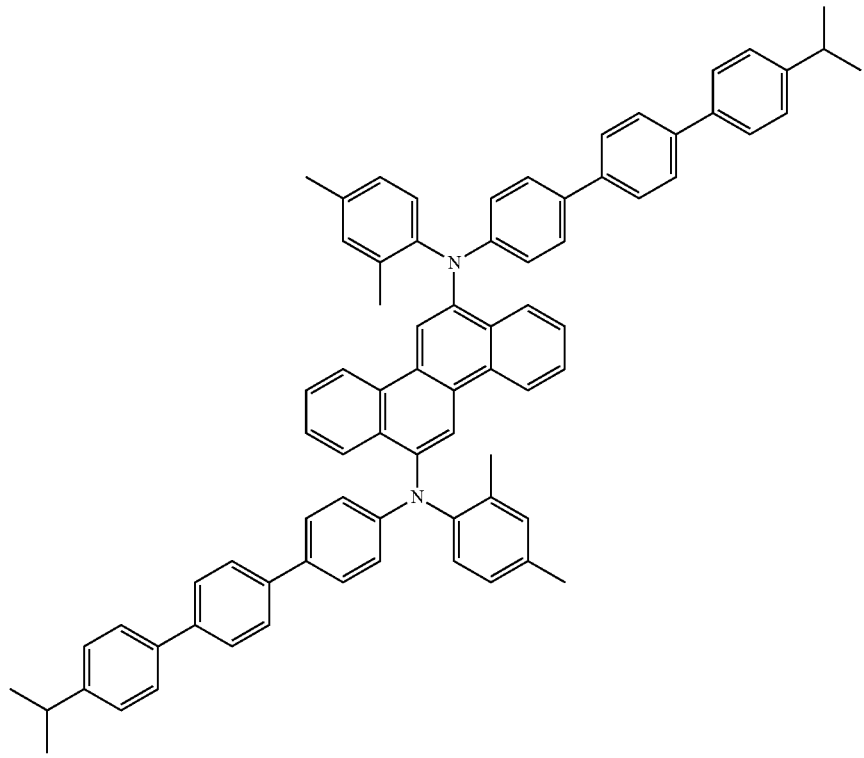
C₇₆H₆₆N₂
Exact Mass: 1006.52
Mol. Wt.: 1007.35
C, 90.62; H, 6.60; N, 2.78

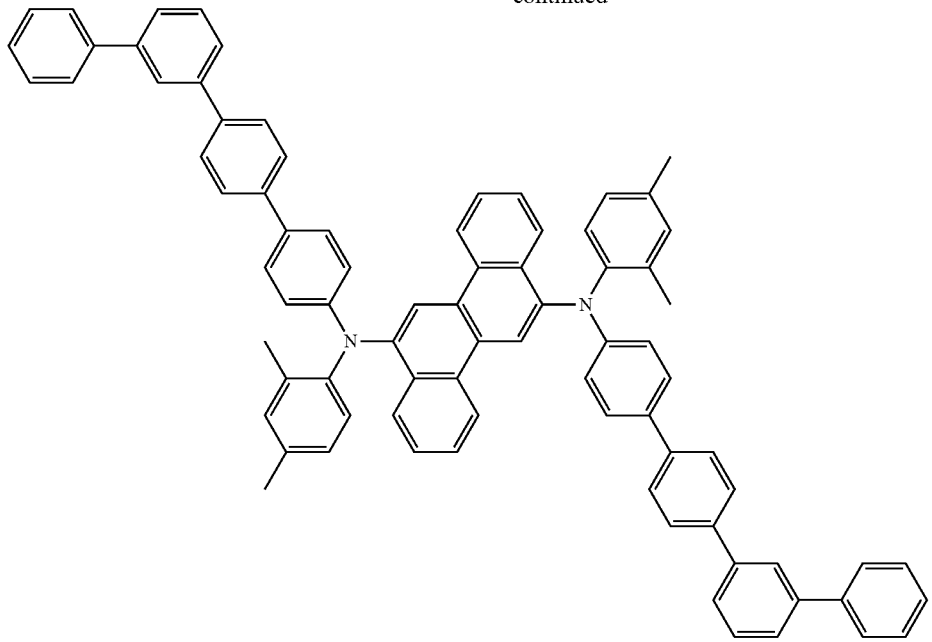

C₈₂H₆₂N₂
Exact Mass: 1074.49
Mol. Wt.: 1075.38
C, 91.58; H, 5.81; 2.60

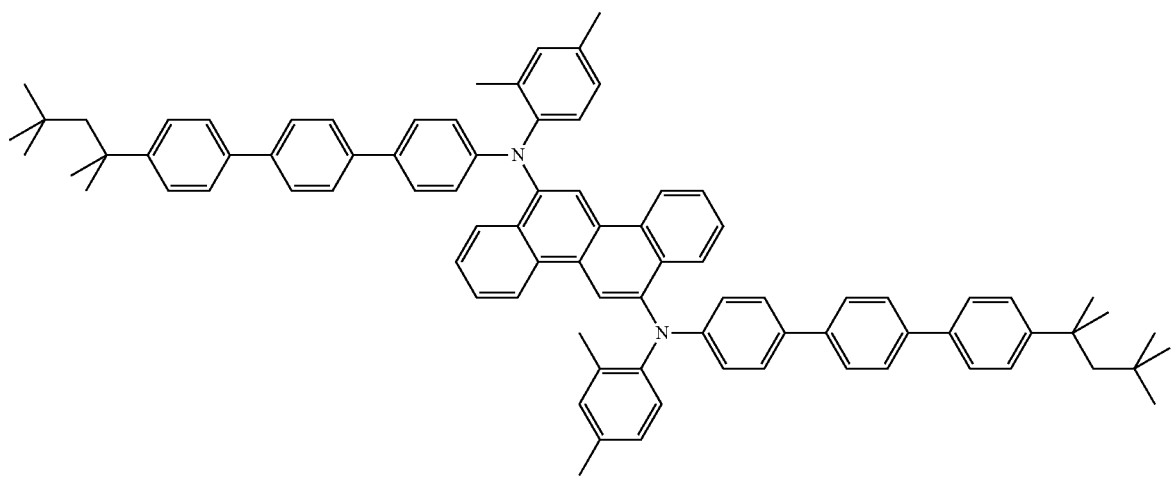

In some embodiments, the second electroluminescent material with green emission color is an organometallic complex of Ir. In some embodiments, the organometallic Ir complex is a tris-cyclometallated complex having the formula $IrL_3$ or a bis-cyclometallated complex having the formula $IrL_2Y$, where Y is a monoanionic bidentate ligand and L has a formula selected from the group consisting of L-1, L-3 through L-7, and L-9 through L-17:

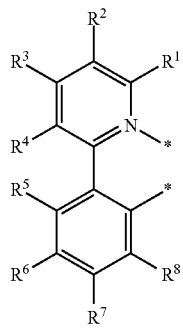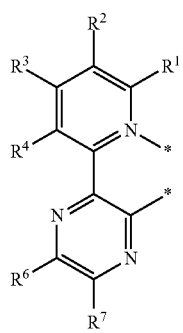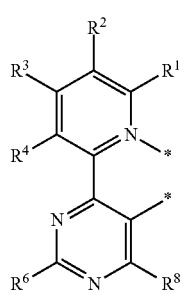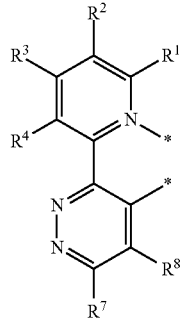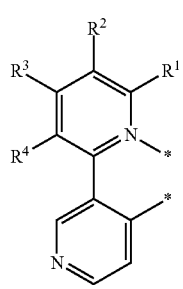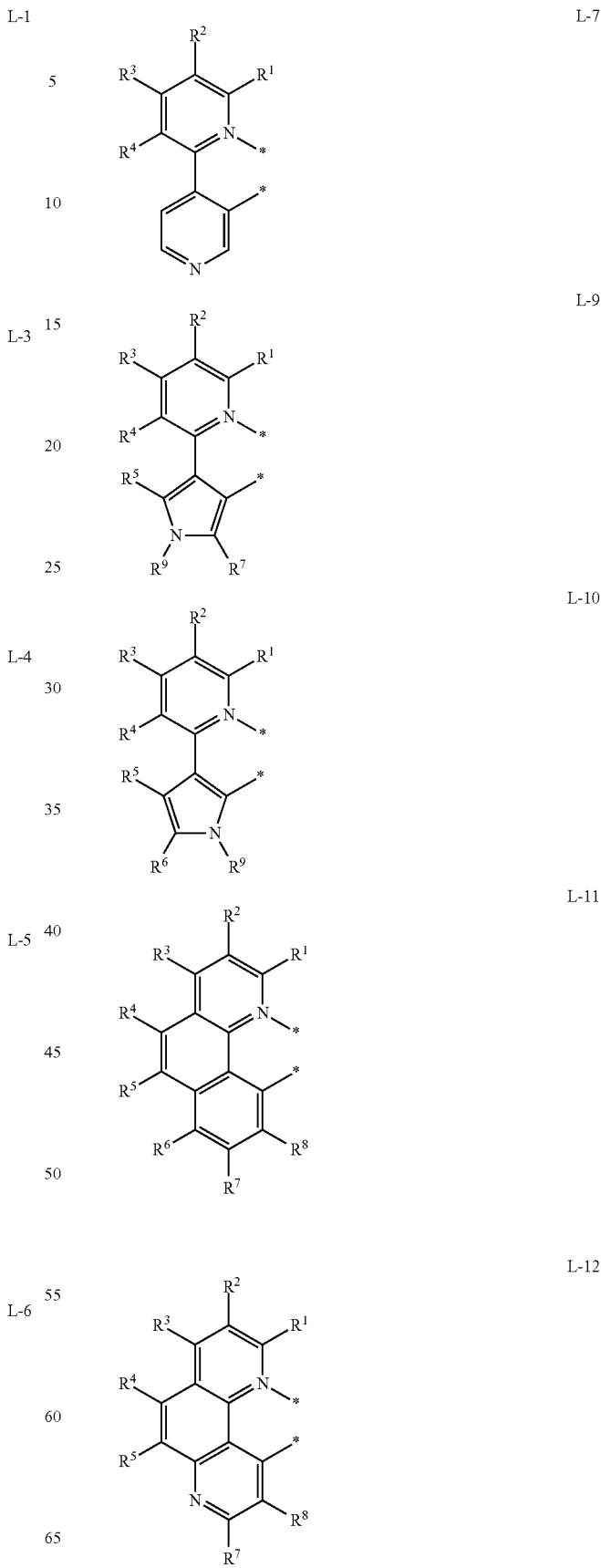

-continued

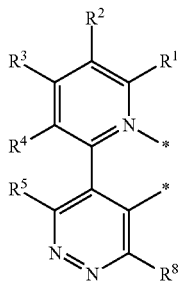
L-13

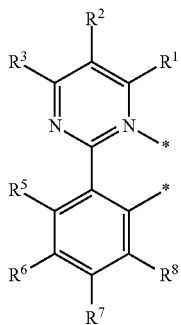
L-14

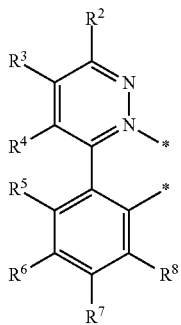
L-15

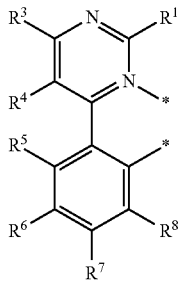
L-16

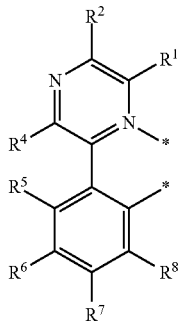
L-17 where $R^1$ through $R^8$ are the same or different and are selected from the group consisting of H, D, electron-donating groups, and electron-withdrawing groups, and $R^9$ is H, D or alkyl.

As discussed above, the emitted color is tuned by the selection and combination of electron-donating and electron-withdrawing substituents and the selection of the Y ligand.

In some embodiments, of Formulae L-1, L-3 through L-7, and L-9 through L-17:
$R^1$=H, D or F;
$R^2$=H, D, F, or alkyl;
$R^3$=H, D or diarylamino;
$R^4$=H, D or F;
$R^5$=H, D or alkyl, or $R^4$ and $R^5$ may be joined together to form a 6-membered aromatic ring;
$R^6$=H, D, F, aryl, fluoroalkoxy, N-carbazolyl, diphenyl-N-carbazolyl, or

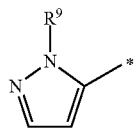

$R^7$=H, D, F, fluoroalkoxy, N-carbazolyl, or diphenyl-N-carbazolyl;
$R^8$=H, D or F; and
$R^9$=H, D, aryl or alkyl,
where the asterisk represents the point of attachment.

In some embodiments, Y is selected from the group consisting of Y-1, Y-2 and Y-3

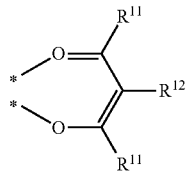
Y-1

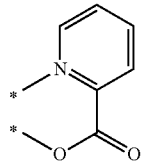
Y-2

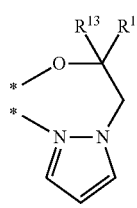
Y-3 wherein:
$R^{11}$ is the same or different at each occurrence and is selected from the group consisting of alkyl and fluoroalkyl;
$R^{12}$ is H, D or F; and
$R^{13}$ is the same or different at each occurrence and is selected from the group consisting of alkyl and fluoroalkyl.

In some embodiments, the alkyl and fluoroalkyl groups have 1-5 carbon atoms. In some embodiments, the alkyl group is methyl. In some embodiments, the fluoroalkyl group is trifluoromethyl. In some embodiments, the aryl group is a heteroaryl. In some embodiments, the aryl group is N-carbazolyl or diphenyl-N-carbazolyl. In some embodiments, the aryl group is phenyl or substituted phenyl. In some embodiments, the aryl group is a phenyl group having one or more substituents selected from the group consisting of F, CN, alkyl, and fluoroalkyl. In some embodiments, the aryl group is selected from the group consisting of p-($C_{1-5}$)alkylphenyl, o-fluorophenyl, m-fluorophenyl, p-fluorophenyl, p-cyanophenyl, and 3,5-bis(trifluoromethyl)phenyl.

In some embodiments, the organometallic Ir complex having green emission color has the formula $IrL_3$ where L has Formula L-1. In some embodiments of Formula L-1, $R^2$ is H, D, or methyl and $R^1$, $R^3$ and $R^4$ are H or D. In some embodiments, $R^6$ is selected from the group consisting of phenyl, substituted phenyl, N-carbazolyl, and diphenyl-N-carbazolyl.

Examples of organometallic Ir complexes with green emission color include, but are not limited to

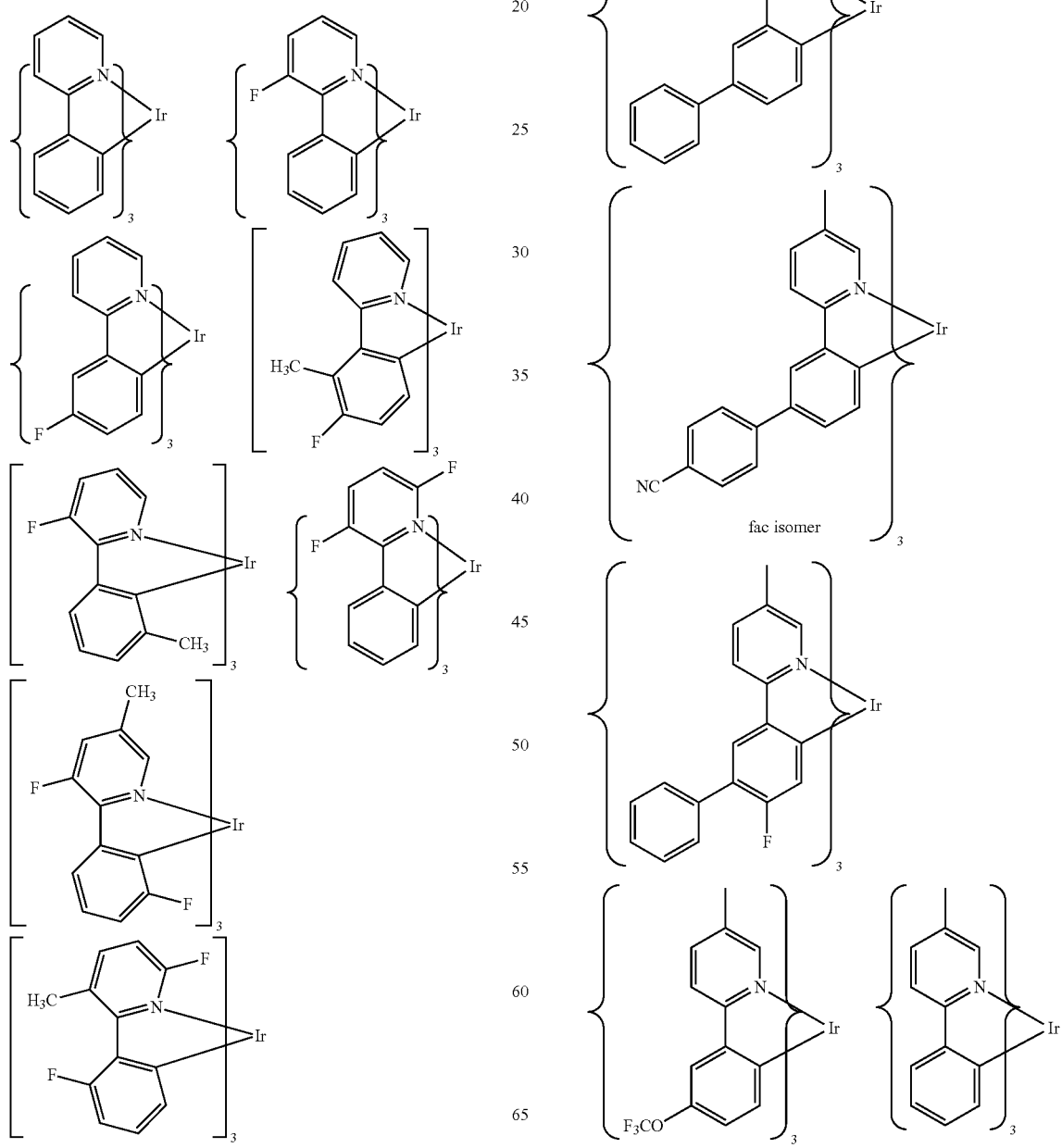

| 31 -continued | 32 -continued |
|---|---|
| 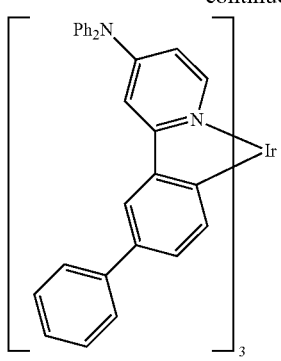 | 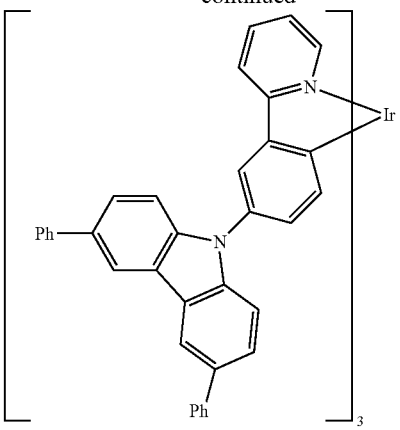 |
| 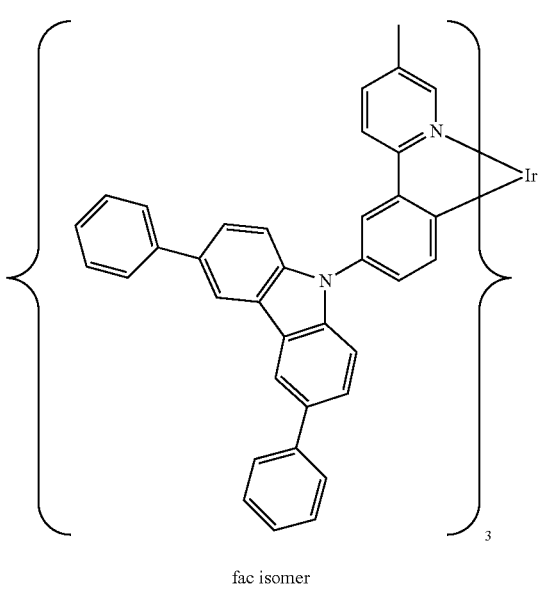
fac isomer | 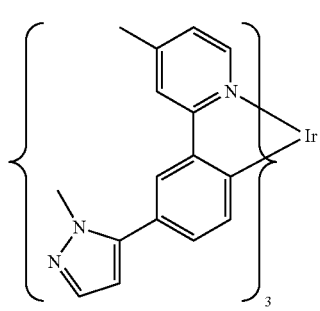
fac isomer |
| | 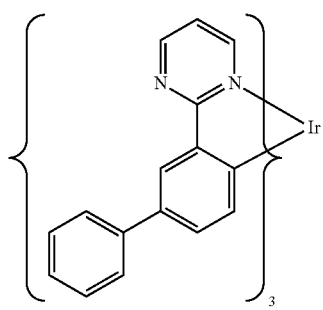 |
| 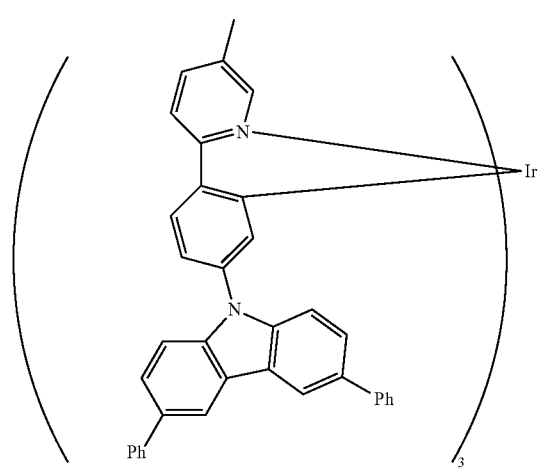 | 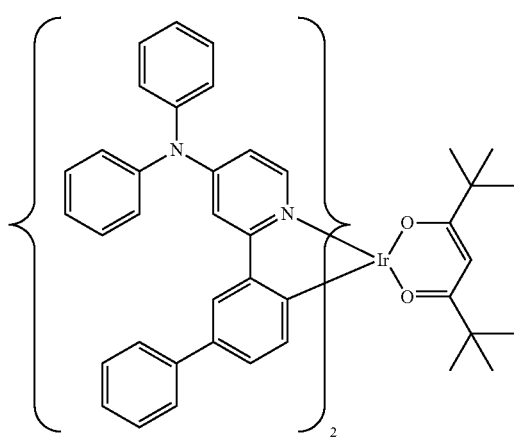 |

In some embodiments, the third electroluminescent material with red-orange emission color is an organometallic complex of Ir. In some embodiments, the organometallic Ir complex is a tris-cyclometallated complex having the formula IrL$_3$ or a bis-cyclometallated complex having the formula IrL$_2$Y, where Y is a monoanionic bidentate ligand and L has a formula selected from the group consisting of Formula L-18, L-19, L-20 and L-21:

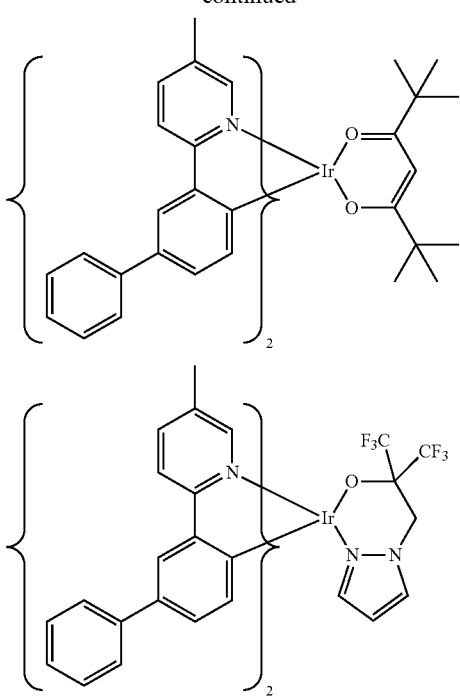

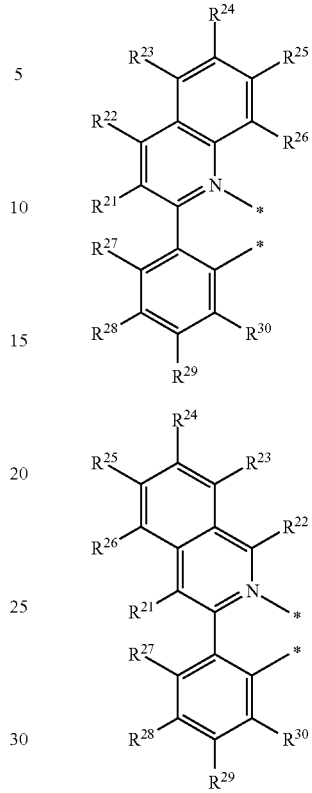

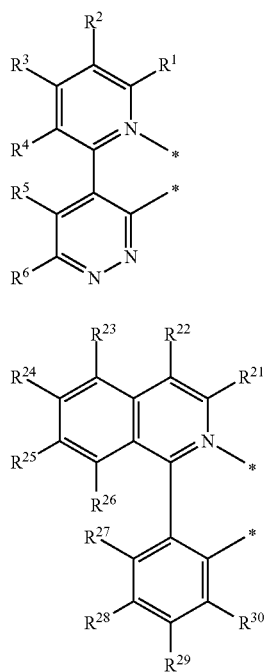

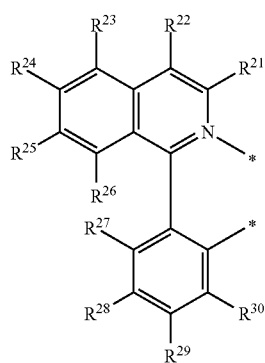

where:
R$^1$ through R$^6$ and R$^{21}$ through R$^{30}$ are the same or different and are selected from the group consisting of H, D, electron-donating groups, and electron-withdrawing groups; and

* represents a point of coordination with Ir.

As discussed above, the emitted color is tuned by the selection and combination of electron-donating and electron-withdrawing substituents, and by the selection of the Y ligand in the bis-cyclometallated complexes. Shifting the color to shorter wavelengths is accomplished by (a) selecting one or more electron-donating substituents for R$^1$ through R$^4$ or R$^{21}$ through R$^{26}$; and/or (b) selecting one or more electron-withdrawing substituents for R$^5$ through R$^6$ or R$^{27}$ through R$^{30}$; and/or (c) selecting a bis-cyclometallated complex with ligand Y-2 or Y-3. Conversely, shifting the color to longer wavelengths is accomplished by (a) selecting one or more electron-withdrawing substituents for R$^1$ through R$^4$ or R$^{21}$ through R$^{26}$; and/or (b) selecting one or more electron-donating substituents for R$^5$ through R$^6$ or R$^{27}$ through R$^{30}$; and/or (c) selecting a bis-cyclometallated complex with ligand Y-1.

In some embodiments of Formulae L-18 through L-21:
R$^1$ through R$^4$ and R$^{21}$ through R$^{26}$ are the same or different and are H, D, alkyl, silyl, or alkoxy, or R$^1$ and R$^2$, R$^2$ and R$^3$ or R$^3$ and R$^4$ in ligand L-18, or R$^{23}$ and R$^{24}$ or R$^{24}$ and R$^{25}$ in ligand L-19 and L-20, or R$^{23}$ and R$^{24}$, R$^{24}$ and R$^{25}$, or R$^{25}$ and R$^{26}$ in Ligand L-21 can be joined together to form a hydrocarbon ring or hetero ring;
R$^{27}$=H, D, alkyl, or silyl;
R$^{28}$=H, D, alkyl, or silyl;
R$^{29}$=H, D, alkyl, silyl, alkoxy, fluoroalkoxy, or aryl; and
R$^{30}$=H, D, alkyl, or silyl.

In some embodiments, Y is selected from the group consisting of Y-1, Y-2 and Y-3

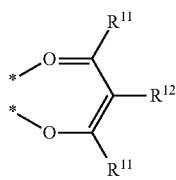 Y-1

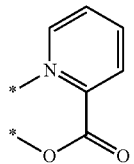 Y-2

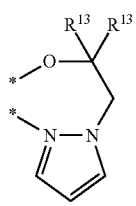 Y-3 wherein:

R$^{11}$ is the same or different at each occurrence and is selected from the group consisting of alkyl and fluoroalkyl;

R$^{12}$ is H, D or F; and

R$^{13}$ is the same or different at each occurrence and is selected from the group consisting of alkyl and fluoroalkyl.

In some embodiments of the formulae, the alkyl, fluoroalkyl, alkoxy and fluoroalkoxy groups have 1-5 carbon atoms. In some embodiments, the alkyl group is methyl. In some embodiments, the alkoxy group is methoxy. In some embodiments, the fluoroalkyl group is trifluoromethyl. In some embodiments, the aryl group is phenyl.

In some embodiments, L=L-19 and the complex has the formula IrL$_3$. In some embodiments, L=L-20 and the complex has the formula IrL$_2$Y or IrL$_3$. In some embodiments, L=L-19 and the complex has the formula IrL$_2$Y.

In some embodiments of L-19, at least one of R$^{23}$ through R$^{26}$ is alkoxy. In some embodiments of L-19, at least one of R$^{27}$ through R$^{30}$ is alkoxy or fluoroalkoxy.

In some embodiments, L=L-20 R$^{23}$ through R$^{26}$ are H or D. In some embodiments of L-20, at least one of R$^{21}$ and R$^{29}$ is a C$_{1-5}$ alkyl group.

In some embodiments of L-21, R$^{23}$ through R$^{26}$ are H or D. In some embodiments of L-21, at least one of R$^{21}$ and R$^{29}$ is a C$_{1-5}$ alkyl group. In some embodiments of L-21, at least one of R$^{27}$ through R$^{30}$ is a C$_{1-5}$ alkoxy or fluoroalkoxy group.

Examples of organometallic Ir complexes having red-orange emission color include, but are not limited to:

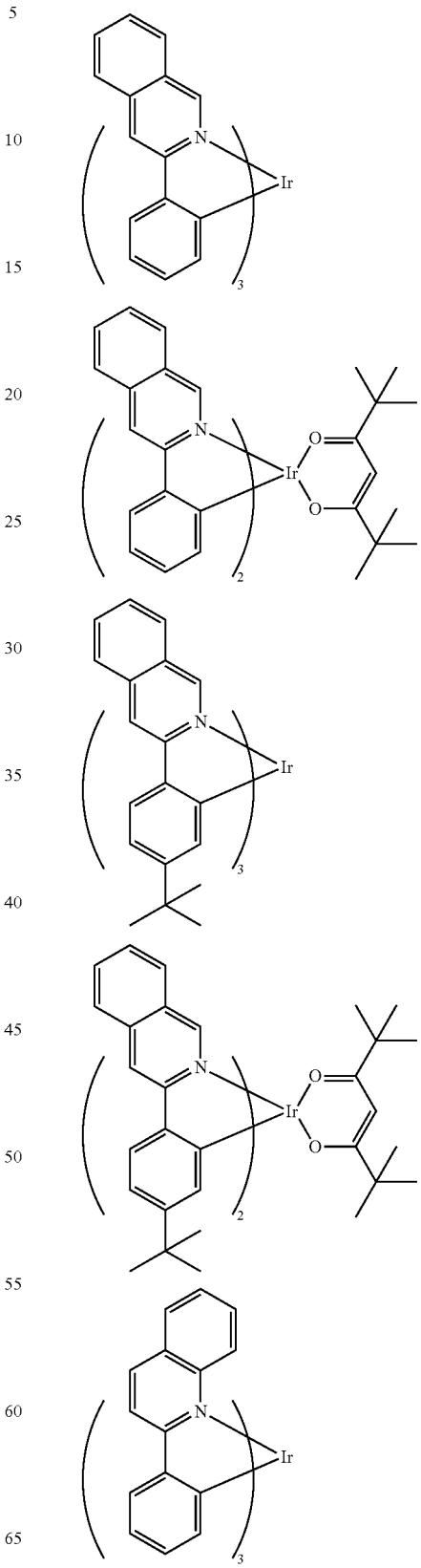

-continued

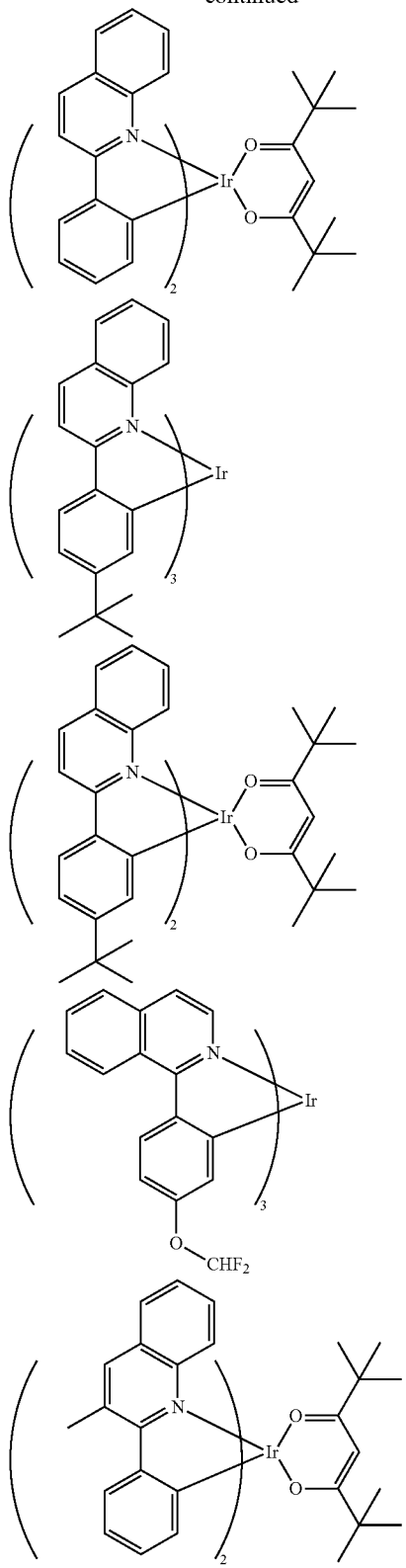

In some embodiments, the electroluminescent materials are present as a dopant in a host material. The term "host material" is intended to mean a material, usually in the form of a layer, to which an electroluminescent material may be added. The host material may or may not have electronic characteristic(s) or the ability to emit, receive, or filter radiation. Host materials have been disclosed in, for example, U.S. Pat. No. 7,362,796, and published U.S. patent application 2006-0115676.

In some embodiments, the host is an anthracene derivative compound. In some embodiments the compound has the formula:

An-L-An where:
 An is an anthracene moiety;
 L is a divalent connecting group.
In some embodiments of this formula, L is a single bond, —O—, —S—, —N(R)—, or an aromatic group. In some embodiments, An is a mono- or diphenylanthryl moiety.

In some embodiments, the host has the formula:

A-An-A where:
 An is an anthracene moiety;
 A is the same or different at each occurrence and is an aromatic group.
In some embodiments, the A groups are attached at the 9- and 10-positions of the anthracene moiety. In some embodiments, A is selected from the group consisting naphthyl, naphthylphenylene, and naphthylnaphthylene. In some embodiments the compound is symmetrical and in some embodiments the compound is non-symmetrical.

In some embodiments, the host has the formula:

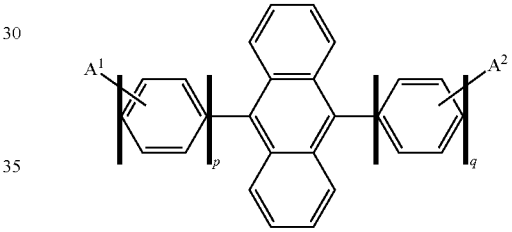

where:
 $A^1$ and $A^2$ are the same or different at each occurrence and are selected from the group consisting of H, D, an aromatic group, an alkyl group and an alkenyl group, or A may represent one or more fused aromatic rings;
 p and q are the same or different and are an integer from 1-3.
In some embodiments, the anthracene derivative is non-symmetrical. In some embodiments, p=2 and q=1.
In some embodiments, at least one of $A^1$ and $A^2$ is a naphthyl group. In some embodiments, additional substituents are present.

In some embodiments, the host material has the formula

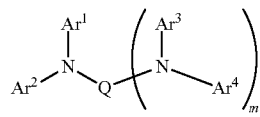

where:
 $Ar^1$ to $Ar^4$ are the same or different and are aryl;
 Q is selected from the group consisting of multivalent aryl groups and

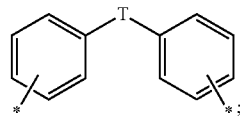

T is selected from the group consisting of $(CR')_a$, $SiR_2$, S, $SO_2$, PR, PO, $PO_2$, BR, and R;

R is the same or different at each occurrence and is selected from the group consisting of alkyl, and aryl;

R' is the same or different at each occurrence and is selected from the group consisting of H, D, and alkyl;

a is an integer from 1-6; and m is an integer from 0-6.

In some embodiments of Formula I, adjacent Ar groups are joined together to form rings such as carbazole. In Formula I, "adjacent" means that the Ar groups are bonded to the same N.

In some embodiments, $Ar^1$ to $Ar^4$ are independently selected from the group consisting of phenyl, biphenyl, terphenyl, quaterphenyl, naphthyl, phenanthryl, naphthylphenyl, and phenanthrylphenyl. Analogs higher than quaterphenyl can also be used, having 5-10 phenyl rings.

In some embodiments, Q is an aryl group having at least two fused rings. In some embodiments, Q has 3-5 fused aromatic rings. In some embodiments, Q is selected from the group consisting of chrysene, phenanthrene, triphenylene, phenanthroline, naphthalene, anthracene, quinoline and isoquinoline.

In some embodiments, the host material is an electron transport material. In some embodiments, the host material is selected from the group consisting of phenanthrolines, quinoxalines, phenylpyridines, benzodifurans, and metal quinolinate complexes.

In some embodiments, the host material is a phenanthroline derivative having the formula

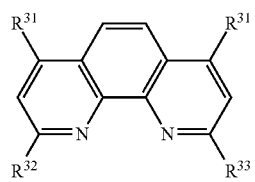

where:

$R^{31}$ is the same or different and is selected from the group consisting of phenyl, naphthyl, naphthylphenyl, triphenylamino, and carbazolylphenyl;

$R^{32}$ and $R^{33}$ are the same or different and are selected from the group consisting of phenyl, biphenyl, naphthyl, naphthylphenyl, phenanthryl, triphenylamino, and carbazolylphenyl.

In some embodiments of the phenanthroline derivative, both $R^{31}$ are phenyl and $R^{32}$ and $R^{33}$ are selected from the group consisting of phenyl, 2-naphthyl, naphthylphenyl, phenanthryl, triphenylamino, and m-carbazolylphenyl.

Some examples of host materials include, but are not limited to:

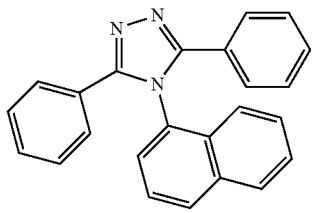

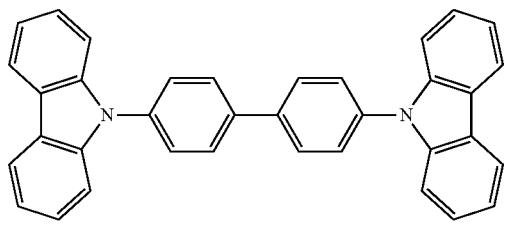

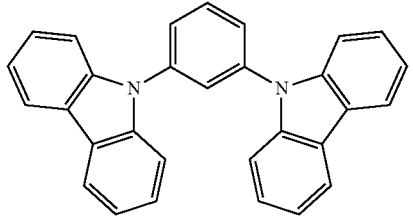

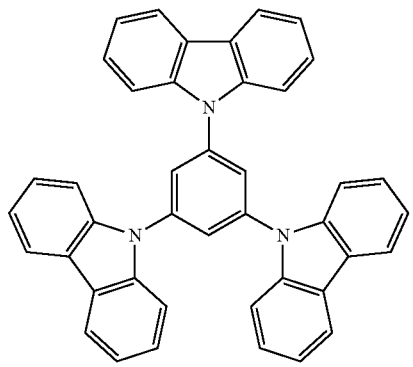

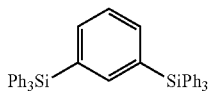

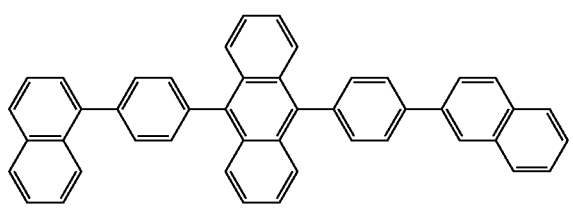

-continued
41
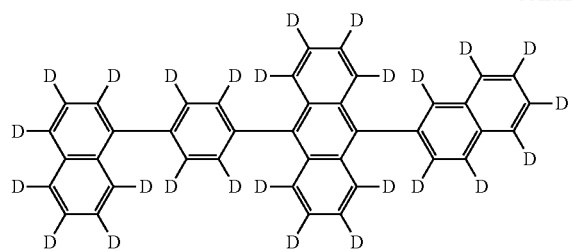
42
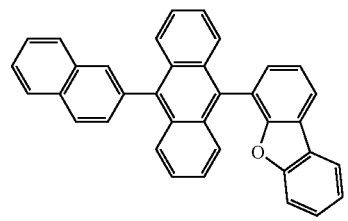
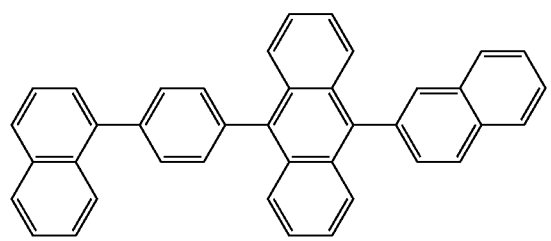
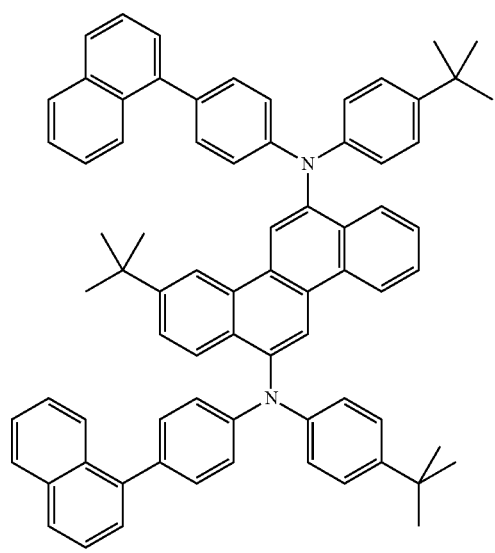
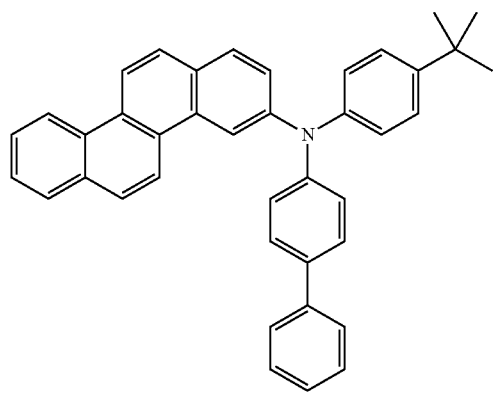
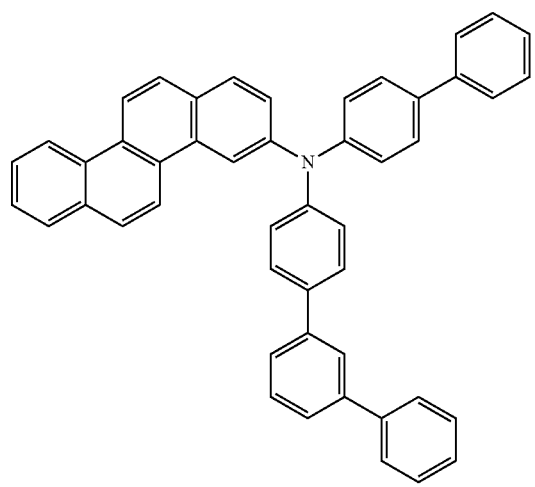

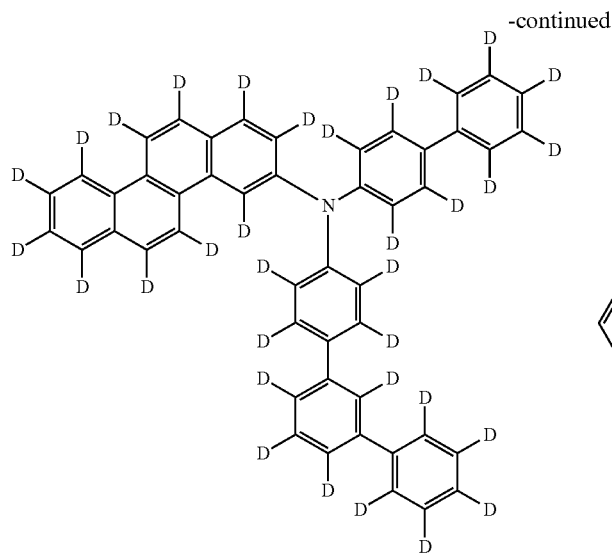
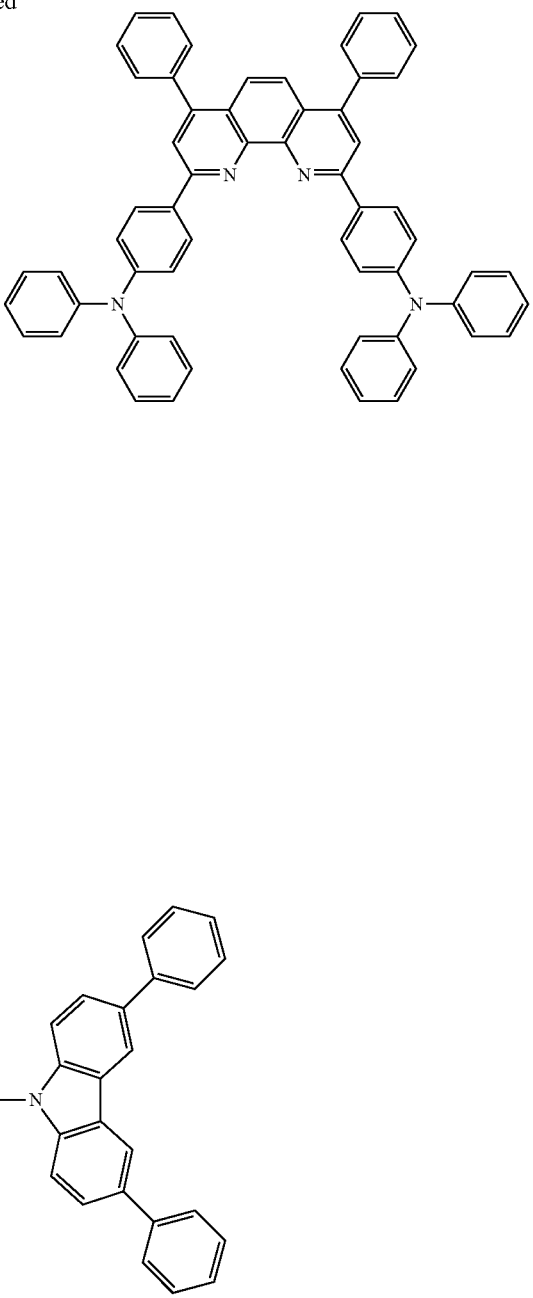
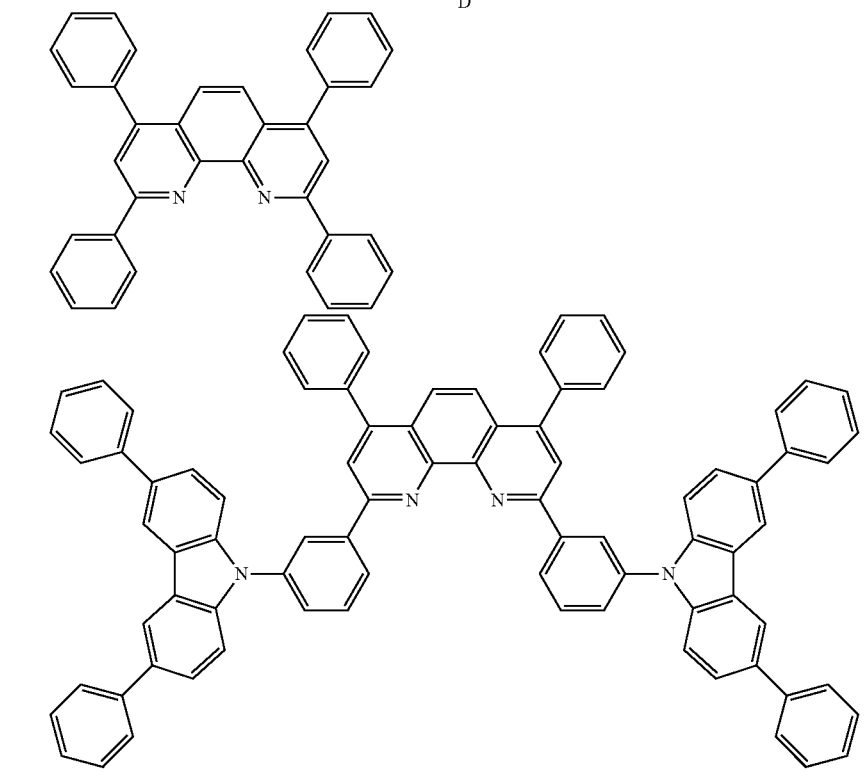

The amount of dopant present in the electroluminescent composition is generally in the range of 3-20% by weight, based on the total weight of the composition; in some embodiments, 5-15% by weight. In some embodiments, a combination of two hosts is present.

The overall emission of white light can be achieved by balancing the emission of the three colors. In some embodiments, when the first electroluminescent material having blue emission is an organometallic iridium complex, the relative emission from the three colors, as measured in $cd/m^2$, is as follows:

blue emission=28-33%,
green emission=32-37%, and
red-orange emission=31-36%.

In some embodiments, when the first electroluminescent material having blue emission is a small molecule luminescent organic compound, the relative emission from the three colors, as measured in $cd/m^2$, is as follows:

blue emission=20-25%,
green emission=47-52%, and
red-orange emission=27-32%.

b. Other Layers

The materials to be used for the other layers of the luminaire described herein can be any of those known to be useful in OLED devices.

The anode is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also comprise an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

The hole injection layer comprises hole injection materials. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer can comprise charge transfer compounds, and the like, such as copper phthalocyanine and the tetrathiafulvalene-tetracyanoquinodimethane system (TTF-TCNQ). In one embodiment, the hole injection layer is made from a dispersion of a conducting polymer and a colloid-forming polymeric acid. Such materials have been described in, for example, published U.S. patent applications 2004-0102577, 2004-0127637, and 2005-0205860, and published PCT application WO 2009/018009.

The hole transport layer comprises hole transport material. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl)biphenyl (CBP); 1,3-bis(carbazol-9-yl)benzene (mCP); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published U.S. patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

The electron transport layer can function both to facilitate electron transport, and also serve as a buffer layer or confinement layer to prevent quenching of the exciton at layer interfaces. Preferably, this layer promotes electron mobility and reduces exciton quenching. Examples of electron transport materials which can be used in the optional electron transport layer, include metal chelated oxinoid compounds, including metal quinolate derivatives such as tris(8-hydroxyquinolato)aluminum (AlQ), bis(2-methyl-8-quinolinolato)(p-phenylphenolato)aluminum (BAlq), tetrakis-(8-hydroxyquinolato)hafnium (HfQ) and tetrakis-(8-hydroxyquinolato) zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport layer further comprises an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

The cathode, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, $Li_2O$, Cs-containing organometallic compounds, CsF, $Cs_2O$, and $Cs_2CO_3$ can also be deposited between the organic layer and the cathode layer to lower the operating voltage. This layer may be referred to as an electron injection layer.

The choice of materials for each of the component layers is preferably determined by balancing the positive and negative charges in the emitter layer to provide a device with high electroluminescence efficiency.

In one embodiment, the different layers have the following range of thicknesses: anode, 500-5000 Å, in one embodiment 1000-2000 Å; hole injection layer, 50-2000 Å, in one embodiment 200-1000 Å; hole transport layer, 50-2000 Å, in one embodiment 200-1000 Å; photoactive layer, 10-2000 Å, in one embodiment 100-1000 Å; electron transport layer, 50-2000 Å, in one embodiment 100-1000 Å; cathode, 200-10000 Å, in one embodiment 300-5000 Å. The desired ratio of layer thicknesses will depend on the exact nature of the materials used.

The OLED luminaire may also include outcoupling enhancements to increase outcoupling efficiency and prevent waveguiding on the side of the device. Types of light outcoupling enhancements include surface films on the viewing side which include ordered structures like e.g. micro spheres or lenses. Another approach is the use of random structures to achieve light scattering like sanding of the surface and or the application of an aerogel.

The OLED luminaires described herein can have several advantages over incumbent lighting materials. The OLED luminaires have the potential for lower power consumption than incandescent bulbs. Efficiencies of greater than 50 lm/W may be achieved. The OLED luminaires can have Improved light quality vs. fluorescent. The color rendering can be greater than 80, vs that of 62 for fluorescent bulbs. The diffuse nature of the OLED reduces the need for an external diffuser unlike all other lighting options. With simple electronics, the brightness and the color can be tunable by the user, unlike other lighting options.

In addition, the OLED luminaires described herein have advantages over other white light-emitting devices. The structure is much simpler than devices with stacked electroluminescent layers. It is easier to tune the color. There is higher material utilization than with devices formed by evaporation of electroluminescent materials. It is possible to use any type of electroluminescent material.

4. PROCESS

The process for making an OLED luminaire, comprises:

providing a substrate having a first patterned electrode thereon;

depositing a first liquid composition in a first pixellated pattern to form a first deposited composition, the first liquid composition comprising a first electroluminescent material in a first liquid medium, said first electroluminescent material having a first emission color;

depositing a second liquid composition in a second pixellated pattern which is laterally spaced from the first pixellated pattern to form a second deposited composition, the second liquid composition comprising a second electroluminescent material in a second liquid medium, said second electroluminescent material having a second emission color;

depositing a third liquid composition in a third pixellated pattern which is laterally spaced from the first and second pixellated patterns to form a third deposited composition, the third liquid composition comprising a third electroluminescent material in a third liquid medium, said third electroluminescent material having a third emission color;

drying the deposited compositions to form pluralities of pixels; and forming a second electrode over all the pixels;

wherein one of the emission colors is blue, one of the emission colors is green, and one of the emission colors is red-orange.

Any known liquid deposition technique can be used, including continuous and discontinuous techniques. Examples of continuous liquid deposition techniques include, but are not limited to spin coating, gravure coating, curtain coating, dip coating, slot-die coating, spray coating, and continuous nozzle coating. Examples of discontinuous deposition techniques include, but are not limited to, ink jet printing, gravure printing, and screen printing.

The drying step can take place after the deposition of each color, after the deposition of all the colors, or any combination thereof. Any conventional drying technique can be used, including heating, vacuum, and combinations thereof. In some embodiments, the drying steps result in a layer that is partially dried. In some embodiments, the drying steps together result in a layer that is essentially completely dried. Further drying of the essentially completely dried layer does not result in any further device performance changes.

In some embodiments, the drying step is carried out after deposition of all the colors. In some embodiments, the drying step is a multi-stage process. In some embodiments, the drying step has a first stage in which the deposited compositions are partially dried and a second stage in which the partially dried compositions are essentially completely dried.

The drying steps can take place after the deposition of each color, after the deposition of all the colors, or any combination thereof. Any conventional drying technique can be used, including heating, vacuum, and combinations thereof.

In some embodiments, the process further comprises deposition of a chemical containment layer. The term "chemical containment layer" is intended to mean a patterned layer that contains or restrains the spread of a liquid material by surface energy effects rather than physical barrier structures. The term "contained" when referring to a layer, is intended to mean that the layer does not spread significantly beyond the area where it is deposited. The term "surface energy" is the energy required to create a unit area of a surface from a material. A characteristic of surface energy is that liquid materials with a given surface energy will not wet surfaces with a lower surface energy.

In some embodiments, the process uses as a substrate a glass substrate with patterned ITO and metal bus lines. The substrate may also contain bank structures to define the individual pixels. The bank structures can be formed and patterned using any conventional technique, such as standard photolithography techniques. Slot-die coating can be used to coat a buffer layer from aqueous solution, followed by a second pass through a slot-die coater for a hole transport layer. These layers are common to all pixels and consequently are not patterned. The light-emitting layers can be patterned using nozzle-printing equipment. In some embodiments, pixels are printed in columns with lateral dimensions of about 40 microns. Both the slot-die process steps and the nozzle-printing can be carried out in a standard clean-room atmosphere. Next the device is transported to a vacuum chamber for the deposition of the electron transport layer and the metallic cathode. This is the only step that requires vacuum chamber equipment. Finally, the whole luminaire is hermetically sealed using encapsulation technology, as described above.

Note that not all of the activities described above in the general description are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. An organic light-emitting diode luminaire comprising a patterned first electrode, a second electrode, and a light-emitting layer therebetween, the light-emitting layer comprising:
a first plurality of pixels comprising a first electroluminescent material having an emission color that is blue;
a second plurality of pixels comprising a second electroluminescent material having an emission color that is green, the second plurality of pixels being laterally spaced from the first plurality of pixels; and
a third plurality of pixels comprising a third electroluminescent material having an emission color that is red-orange, the third plurality of pixels being laterally spaced from the first and second pluralities of pixels;
wherein the additive mixing of the three emitted colors results in an overall emission of white light; and
wherein the first electroluminescent material with blue emission color has Formula I Formula I ![Formula I structure]

wherein:
$R^{14}$, $R^{15}$, $R^{16}$ and $R^{17}$ are the same or different and are selected from the group consisting of H, D, and alkyl, where $R^{14}$ and $R^{15}$ groups or $R^{16}$ and $R^{17}$ groups may be joined together to form a 5- or 6-membered aliphatic ring;
$R^{18}$ and $R^{19}$ are the same or different and are selected from the group consisting of D, alkyl groups, silyl groups, m-phenyl, o-phenyl, p-phenyl, m-N-carbazolyl, and p-N-carbazolyl;
$R^{20}$ is the same or different at each occurrence and is selected from the group consisting of D, alkyl groups, silyl groups, phenyl, and biphenyl, or two adjacent $R^{20}$ groups can join together to form a naphthyl or fluorenyl group;
a and b are the same or different and are an integer from 0-10;
c and d are the same or different and are an integer from 1-5;
f, q, h, and i, are the same or different at each occurrence and are an integer from 0-4; and
e and j are the same or different at each occurrence and are an integer from 0-5.

2. The luminaire of claim 1, wherein the relative emission from the blue, green and red-orange colors, measured in $cd/m^2$, is:
blue emission=20-25%,
green emission=47-52%, and
red-orange emission=27-32%.

3. The luminaire of claim 1, wherein the second electroluminescent material with green emission color is a tris-cyclometallated complex having the formula $IrL_3$ or a bis-cyclometallated complex having the formula $IrL_2Y$, where Y is a monoanionic bidentate ligand and L has a formula selected from the group consisting of L-1, L-3 through L-7, and L-9 through L-17:

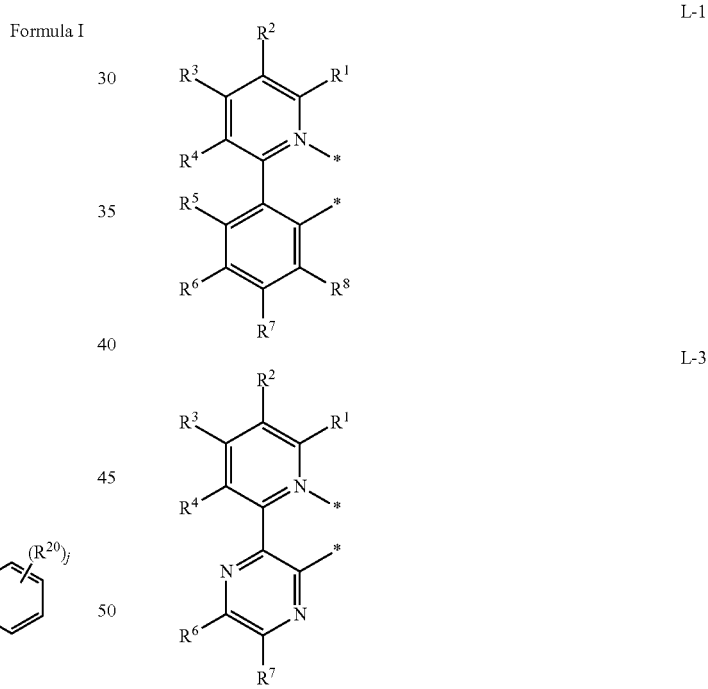

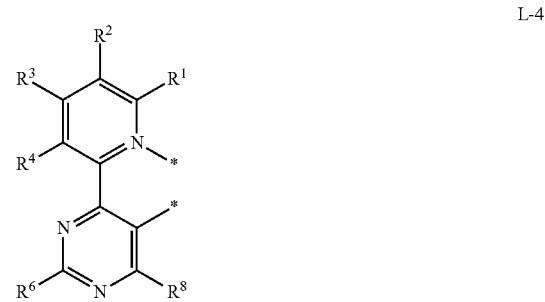

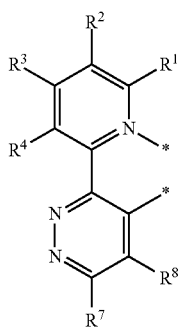 L-5
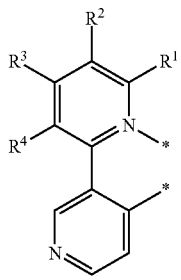 L-6
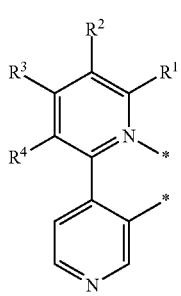 L-7
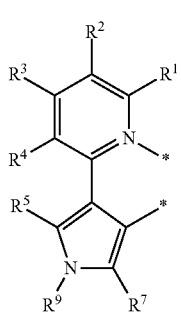 L-9
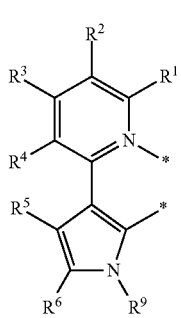 L-10
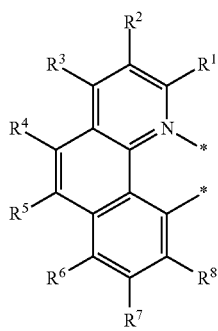 L-11
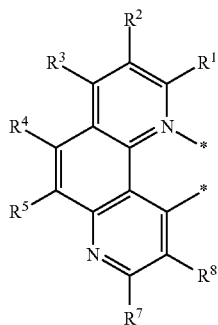 L-12
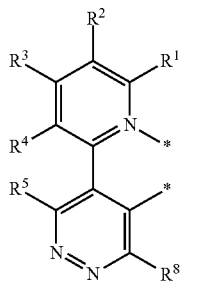 L-13
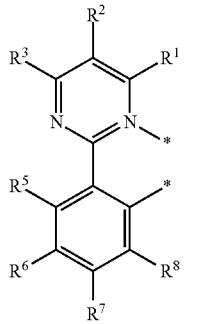 L-14
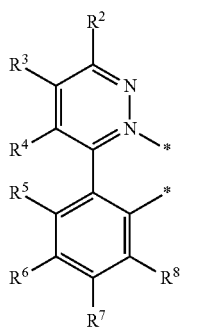 L-15

-continued

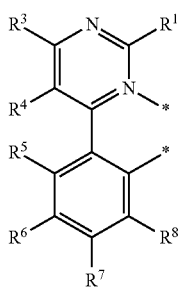

L-16

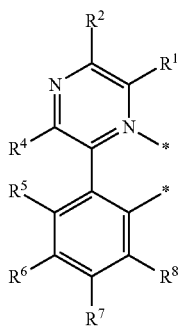

L-17 where R¹ through R⁸ are the same or different and are selected from the group consisting of H, D, electron-donating groups, and electron-withdrawing groups, and R⁹ is H, D, or alkyl.

4. The luminaire of claim 1, wherein the third electroluminescent material with red-orange emission color is a tris-cyclometallated complex having the formula $IrL_3$ or a bis-cyclometallated complex having the formula $IrL_2Y$, where Y is a monoanionic bidentate ligand and L has a formula selected from the group consisting of Formula L-18, L-19, L-20 and L-21:

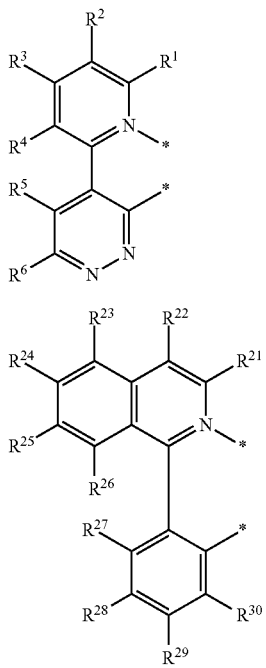

L-18

L-19

-continued

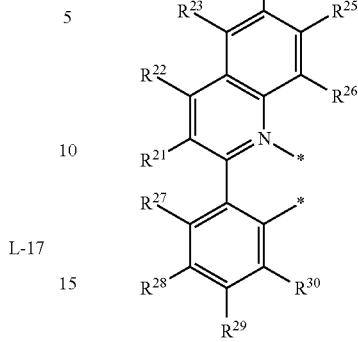

L-20

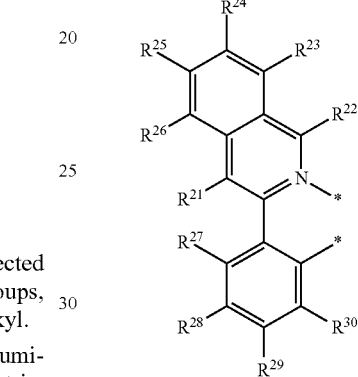

L-21 where:

R¹ through R⁶ and R²¹ through R³⁰ are the same or different and are selected from the group consisting of H, D, electron-donating groups, and electron-withdrawing groups; AND

* represents a point of coordination with Ir.

5. The luminaire of claim 1, wherein any one or more of the first, second, and third electroluminescent materials comprise a host material having a formula selected from:

An-L-An and

A-An-A wherein An is an anthracene moiety, L is a divalent connecting group, and A is the same or different at each occurrence and is an aromatic group.

6. The luminaire of claim 1, wherein one or more of the first, second, and third electroluminescent materials comprises a host material having the formula

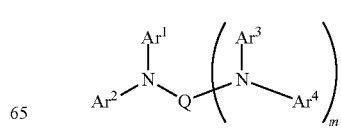

where:
Ar$^1$ to Ar$^4$ are the same or different and are aryl;
Q is selected from the group consisting of multivalent aryl groups and

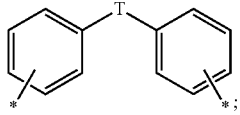

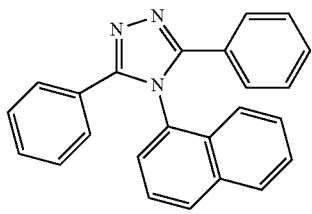

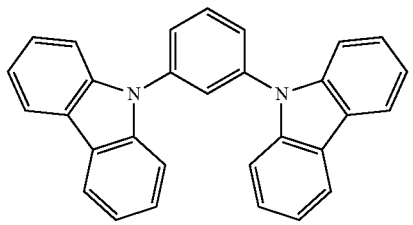

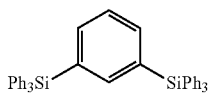

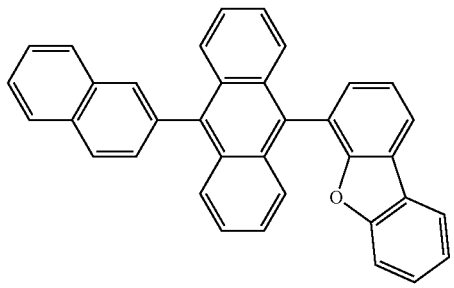

T is selected from the group consisting of (CR')$_a$, SiR$_2$, S, SO$_2$, PR, PO, PO$_2$, BR, and R;

R is the same or different at each occurrence and is selected from the group consisting of alkyl, and aryl;

R' is the same or different at each occurrence and is selected from the group consisting of H, D, and alkyl;

a is an integer from 1-6; and m is an integer from 0-6.

7. The luminaire of claim 1, wherein one or more of the first, second, and third electroluminescent materials comprise a host material selected from the group consisting of:

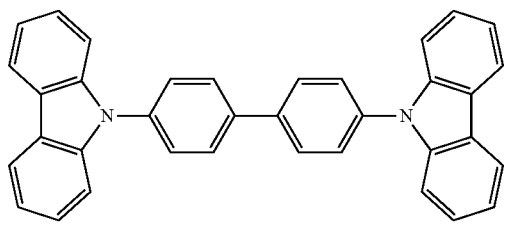

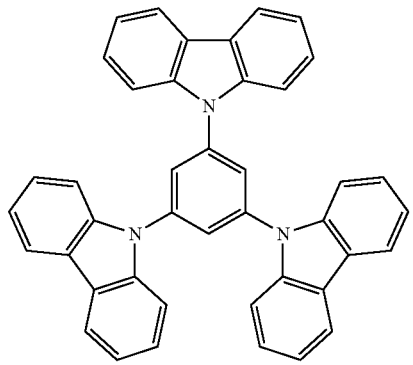

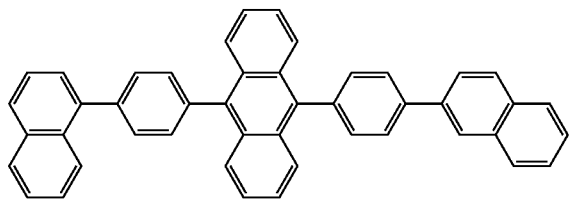

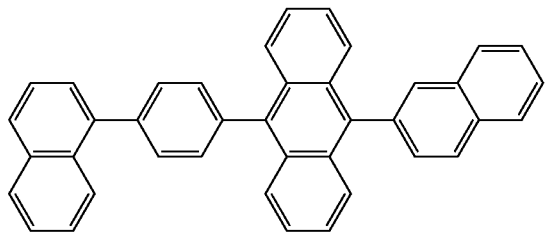

-continued
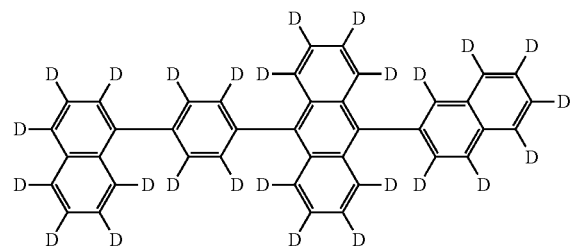
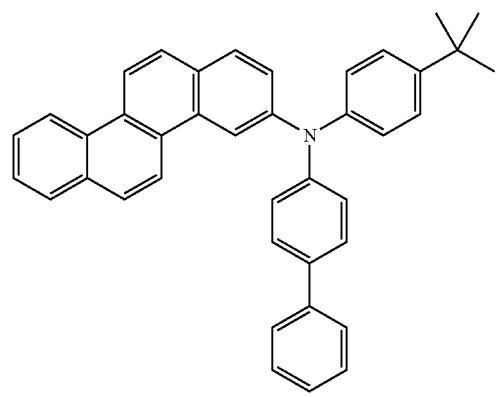
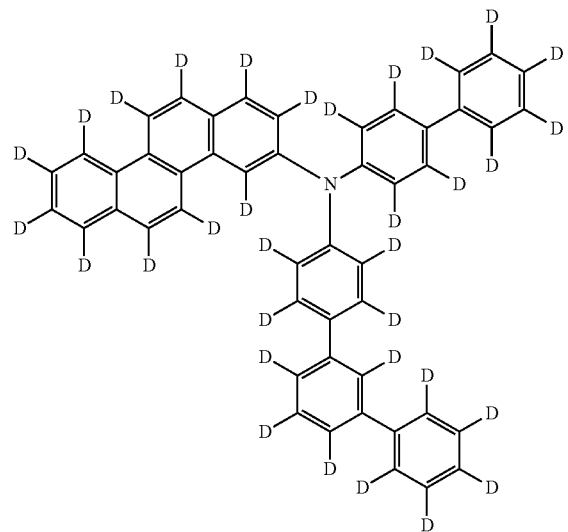
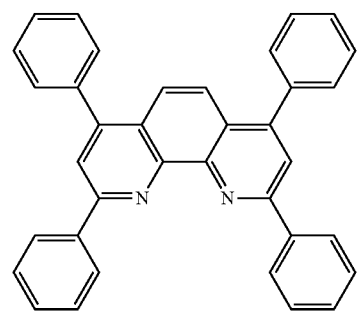
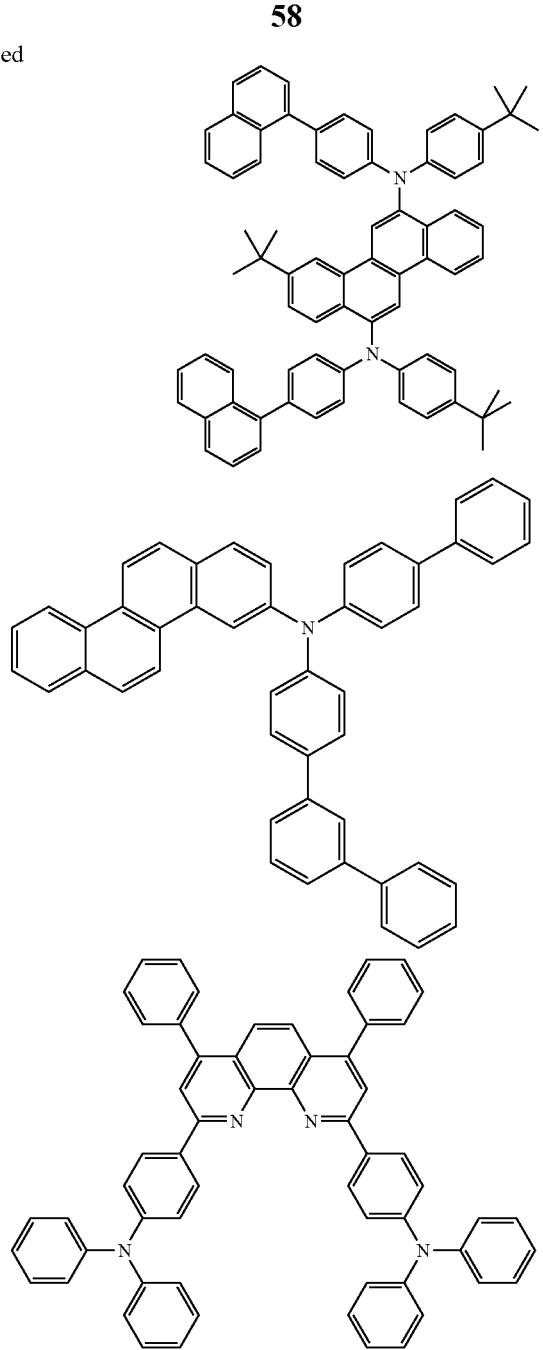
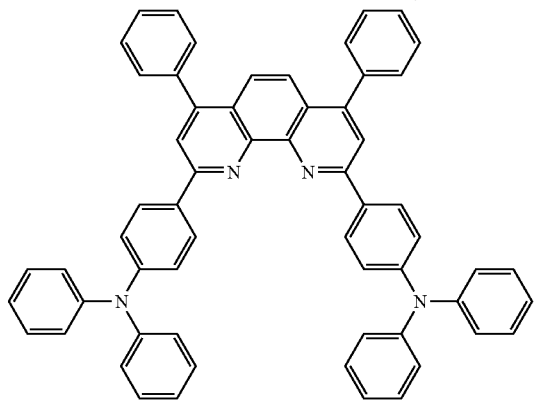

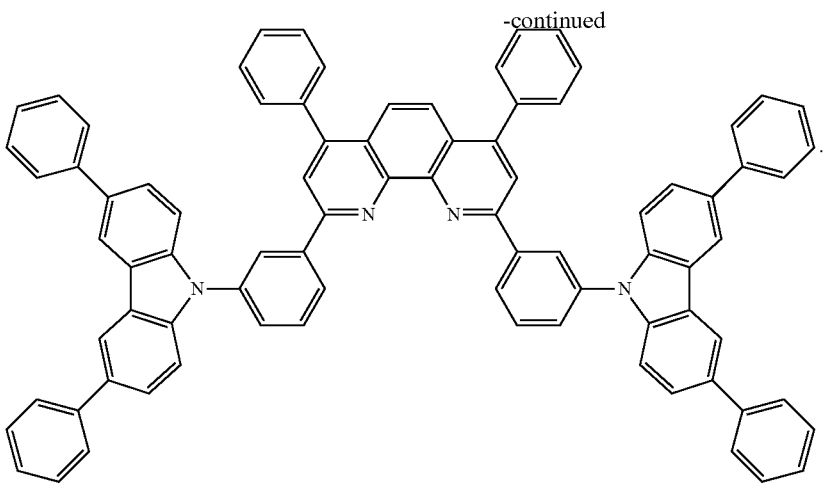

8. The luminaire of claim 1, wherein one or more of the first, second, and third electroluminescent materials comprise a host material having the formula

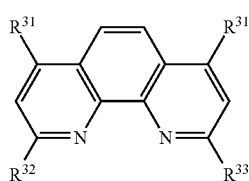

where:
R$^{31}$ is the same or different and is selected from the group consisting of phenyl, naphthyl, naphthylphenyl, triphenylamino, and carbazolylphenyl;
R$^{32}$ and R$^{33}$ are the same or different and are selected from the group consisting of phenyl, biphenyl, naphthyl, naphthylphenyl, phenanthryl, triphenylamino, and carbazolylphenyl.

9. The luminaire of claim 3, wherein:
R$^1$=H, D or F;
R$^2$=H, D, F, or alkyl;
R$^3$=H, D or diarylamino;
R$^4$=H, D or F;
R$^5$=H, D or alkyl, or R$^4$ and R$^5$ may be joined together to form a 6-membered aromatic ring;
R$^6$=H, D, CN, F, aryl, fluoroalkoxy, N-carbazolyl, diphenyl-N-carbazolyl, or

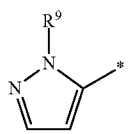

R$^7$=H, D, F, fluoroalkoxy, N-carbazolyl, or diphenyl-N-carbazolyl;
R$^8$=H, D or F; and
R$^9$=H, D, aryl or alkyl,
where the asterisk represents the point of attachment.

10. The luminaire of claim 3, wherein Y is selected from the group consisting of Y-1, Y-2 and Y-3

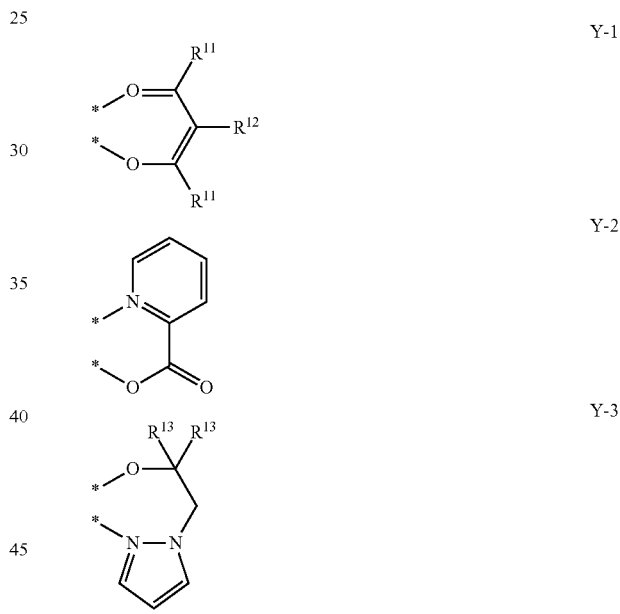

wherein:
R$^{11}$ is the same or different at each occurrence and is selected from the group consisting of alkyl and fluoroalkyl;
R$^{12}$ is H, D or F; and
R$^{13}$ is the same or different at each occurrence and is selected from the group consisting of alkyl and fluoroalkyl.

11. The luminaire of claim 4, wherein:
R$^1$ through R$^4$ and R$^{21}$ through R$^{26}$ are the same or different and are H, D, alkyl, silyl, or alkoxy, or R$^1$ and R$^2$, R$^2$ and R$^3$ or R$^3$ and R$^4$ in ligand L-18, or R$^{23}$ and R$^{24}$ or R$^{24}$ and R$^{25}$ in ligand L-19 and L-20, or R$^{23}$ and R$^{24}$, R$^{24}$ and R$^{25}$, or R$^{25}$ and R$^{26}$ can be joined together to form a hydrocarbon ring or hetero ring;
R$^{27}$=H, D, alkyl, or silyl;
R$^{28}$=H, D, alkyl, or silyl;
R$^{29}$=H, D, alkyl, silyl, alkoxy, fluoroalkoxy, or aryl; and
R$^{30}$=H, D, alkyl, or silyl.

12. The luminaire of claim 4, wherein Y is selected from the group consisting of Y-1, Y-2 and Y-3

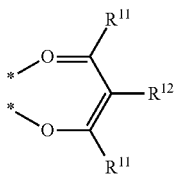
Y-1

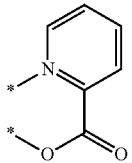
Y-2

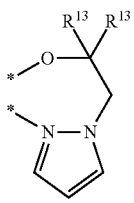
Y-3 wherein:
$R^{11}$ is the same or different at each occurrence and is selected from the group consisting of alkyl and fluoroalkyl;
$R^{12}$ is H, D or F; and
$R^{13}$ is the same or different at each occurrence and is selected from the group consisting of alkyl and fluoroalkyl.

13. The luminaire of claim 5, wherein the host material has the formula

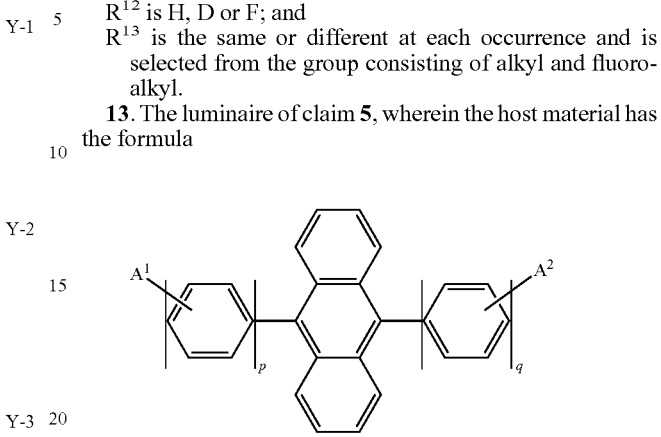

where:
$A^1$ and $A^2$ are the same or different at each occurrence and are selected from the group consisting of H, D, an aromatic group, an alkyl group and an alkenyl group, or A may represent one or more fused aromatic rings;
p and q are the same or different and are an integer from 1-3.

* * * * *